United States Patent
Kim

(10) Patent No.: US 8,035,396 B2
(45) Date of Patent: Oct. 11, 2011

(54) METHOD AND DEVICE FOR MEASURING INTERNAL IMPEDANCE OF STATIONARY BATTERY

(76) Inventor: Deuk Soo Kim, Seoul (KR)

( * ) Notice: Subject to any disclaimer, the term of this patent is extended or adjusted under 35 U.S.C. 154(b) by 733 days.

(21) Appl. No.: 12/096,794

(22) PCT Filed: Nov. 17, 2006

(86) PCT No.: PCT/KR2006/004845
§ 371 (c)(1),
(2), (4) Date: Aug. 8, 2008

(87) PCT Pub. No.: WO2007/066911
PCT Pub. Date: Jun. 14, 2007

(65) Prior Publication Data
US 2008/0303528 A1    Dec. 11, 2008

(30) Foreign Application Priority Data

Dec. 8, 2005   (KR) .................. 10-2005-0119184
Sep. 13, 2006  (KR) .................. 10-2006-0088525

(51) Int. Cl.
*G01N 27/416*   (2006.01)
(52) U.S. Cl. ........ 324/430; 324/433; 324/425; 324/427; 324/426
(58) Field of Classification Search .......... 320/124, 320/125, 134, 135, 136, 148, 149; 324/425, 324/426, 427, 429, 430, 432, 525
See application file for complete search history.

(56) References Cited

U.S. PATENT DOCUMENTS

| | | | | | |
|---|---|---|---|---|---|
| 5,773,978 | A | * | 6/1998 | Becker | 324/430 |
| 6,118,275 | A | * | 9/2000 | Yoon et al. | 324/427 |
| 6,294,896 | B1 | * | 9/2001 | Champlin | 320/134 |
| 7,068,042 | B2 | * | 6/2006 | Allan et al. | 324/525 |
| 7,773,353 | B2 | * | 8/2010 | Uchida | 361/49 |
| 7,786,700 | B2 | * | 8/2010 | Tohyama | 320/134 |
| 2004/0009572 | A1 | * | 1/2004 | Felice et al. | 435/243 |
| 2004/0207367 | A1 | * | 10/2004 | Taniguchi et al. | 320/149 |
| 2008/0303528 | A1 | * | 12/2008 | Kim | 324/430 |

FOREIGN PATENT DOCUMENTS

KR   10-2004-0072249 A   8/2004
KR   10-2005-0078950 A   8/2005

* cited by examiner

*Primary Examiner* — Edward Tso
*Assistant Examiner* — Alexis Boateng
(74) *Attorney, Agent, or Firm* — LRK Patent Law Firm

(57) ABSTRACT

Battery system is widely used in emergent power plant or communication network power plant and its effective management is important. When any one of batteries connected to each other in series is failed during operation of the battery system, since reliability of the system cannot be secured, a problem is arisen to stable operation of the communication network. In a method of separating inferior battery, the battery is operated in floating charge state without separation to generate square current containing charge current and easily generated to flow through the battery cell, voltage signal generated from terminal voltage of the battery by the measuring signal is processed such that only internal impedance voltage signal is separated from harmonics ripple voltage and noise voltage by a synchronized detection calculating algorithm to calculate the internal impedance or effective value thereof (resistance component). When the algorithm is applied after filtering only fundamental frequency and similar component by general filter, measuring precision can be improved and measuring time can be reduced.

17 Claims, 7 Drawing Sheets

[Fig. 1]
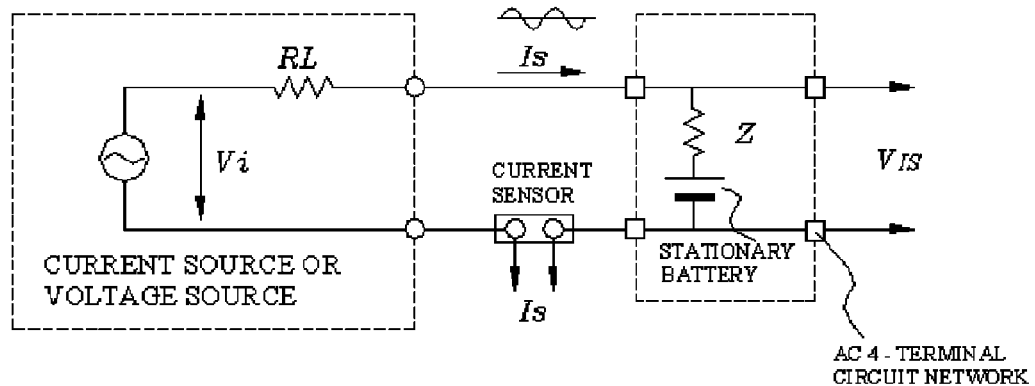
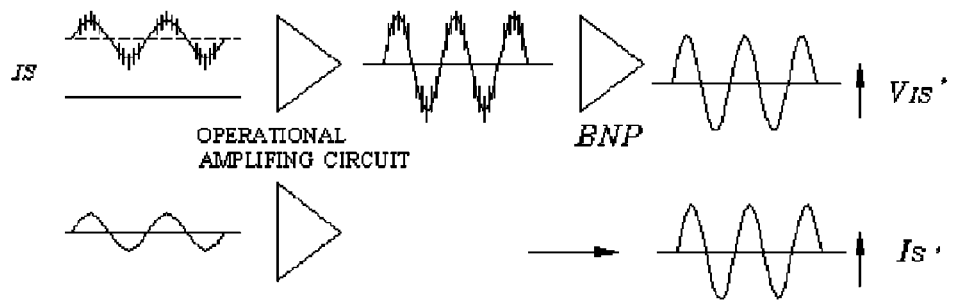
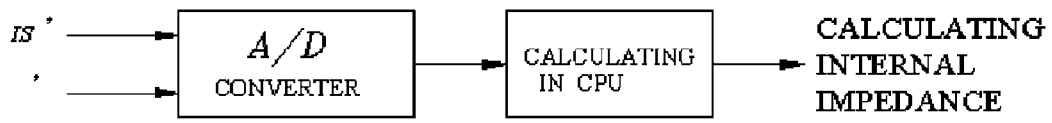
[Fig. 2]
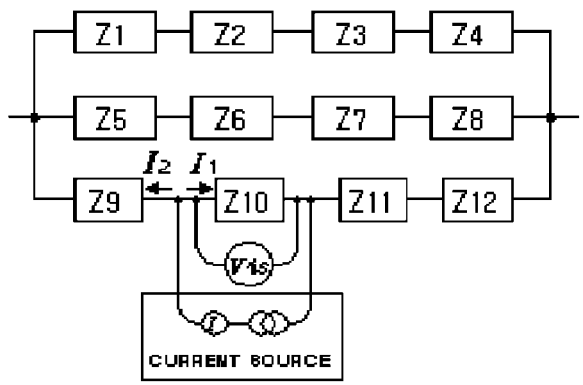

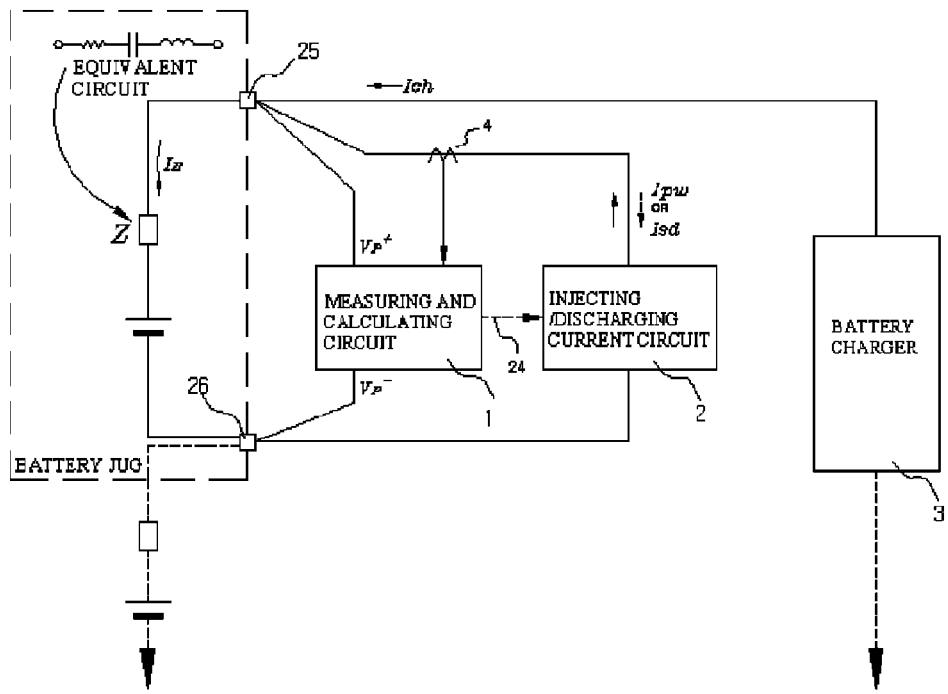
[Fig. 3]
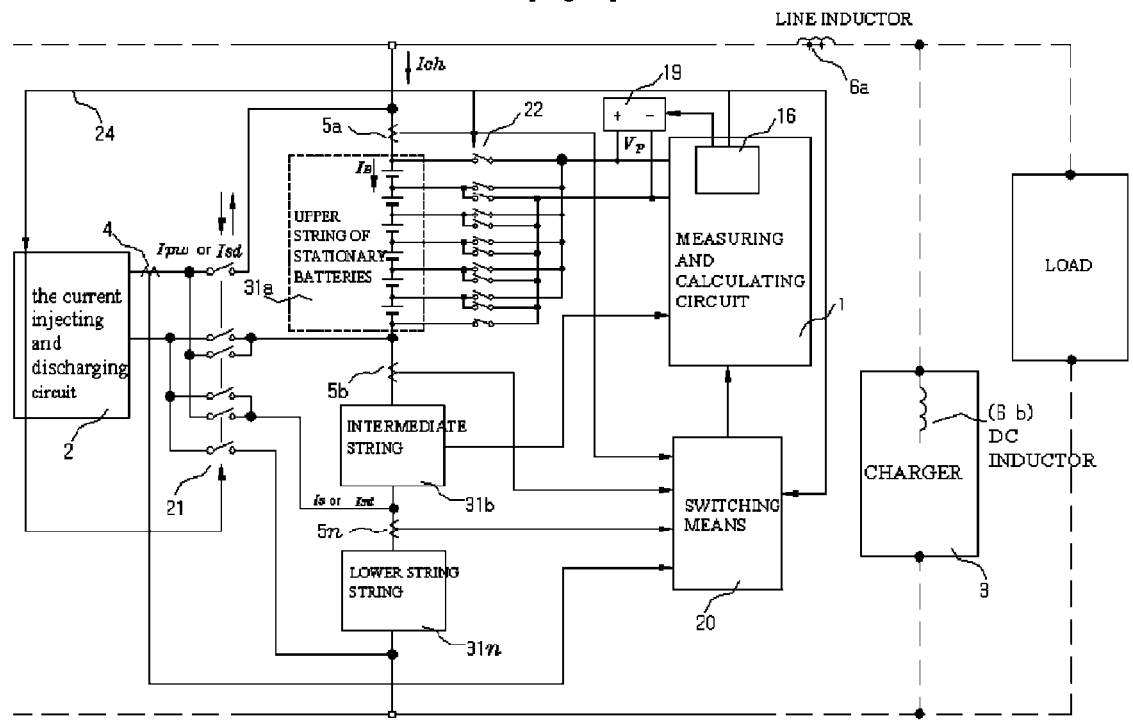
[Fig. 4]

[Fig. 5]
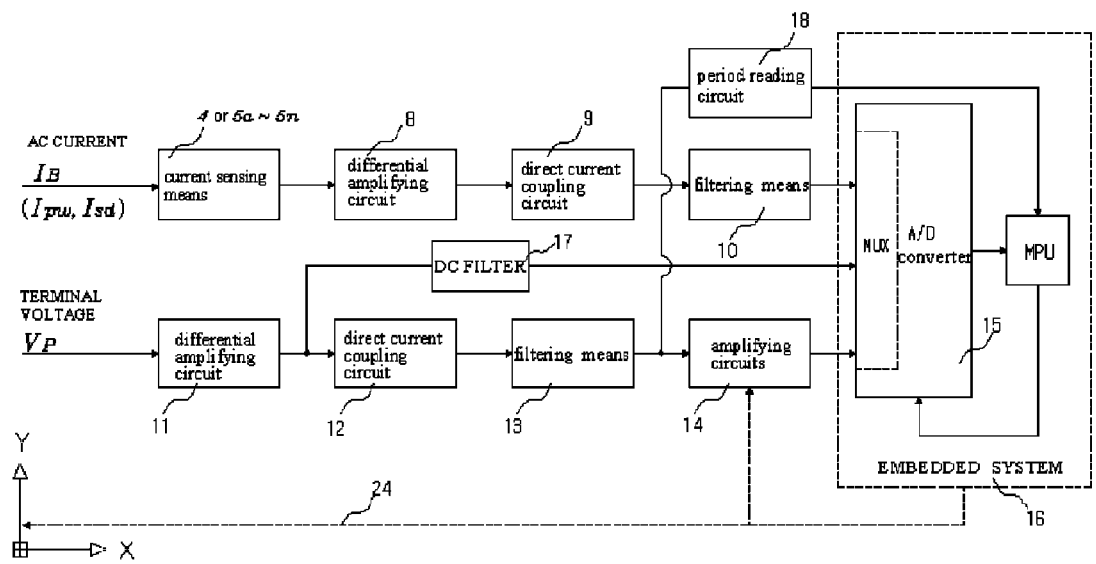
[Fig. 6]
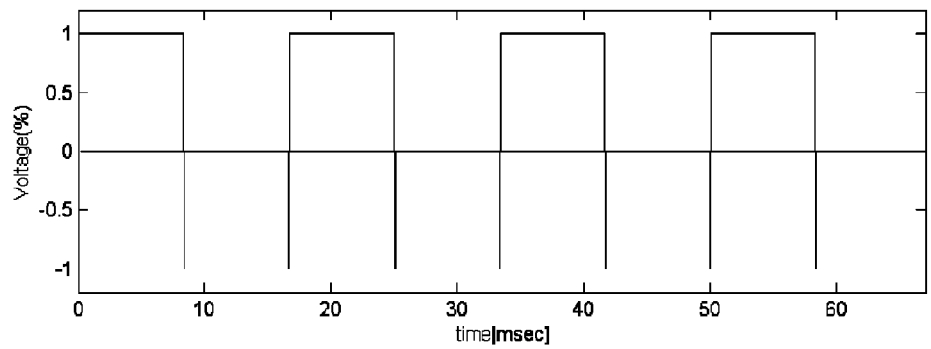
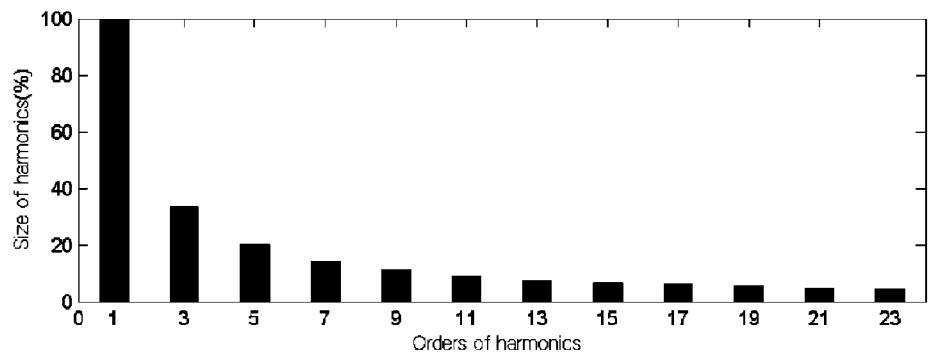

[Fig. 7]
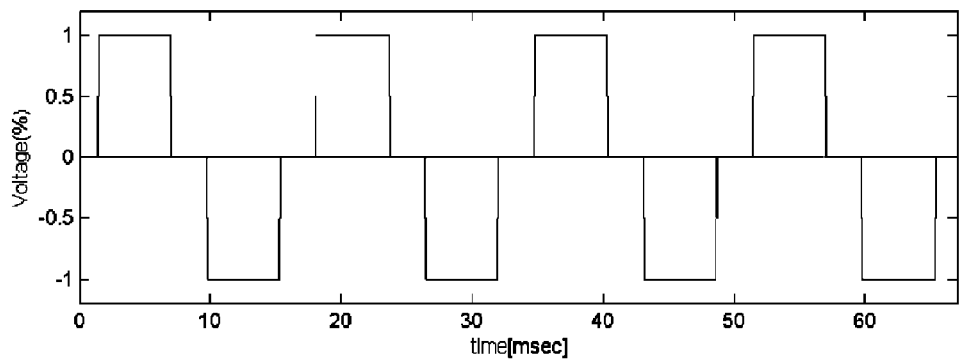
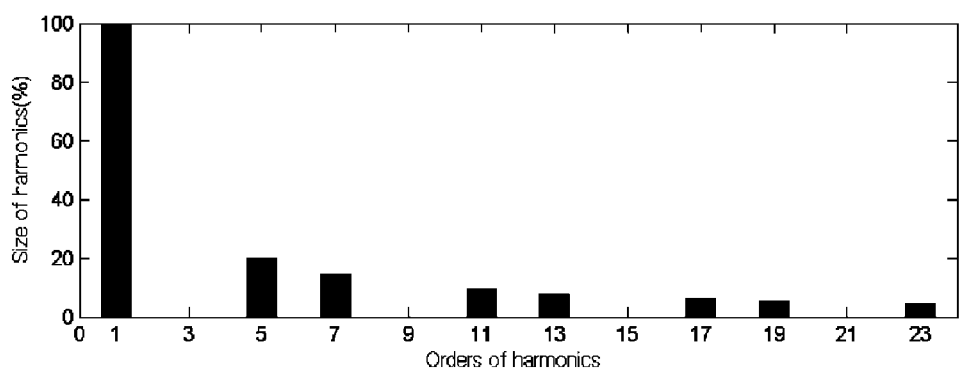
[Fig. 8]
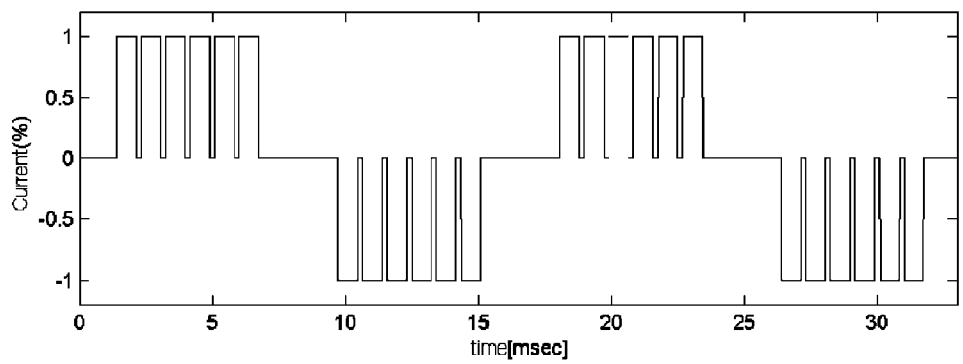
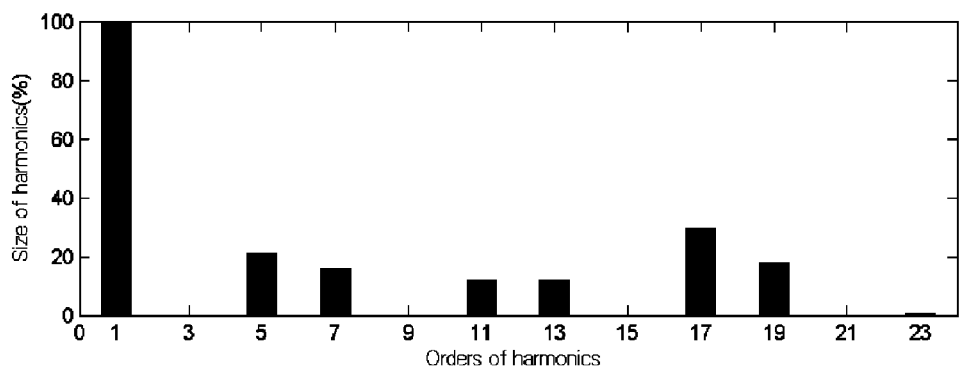

[Fig. 9]
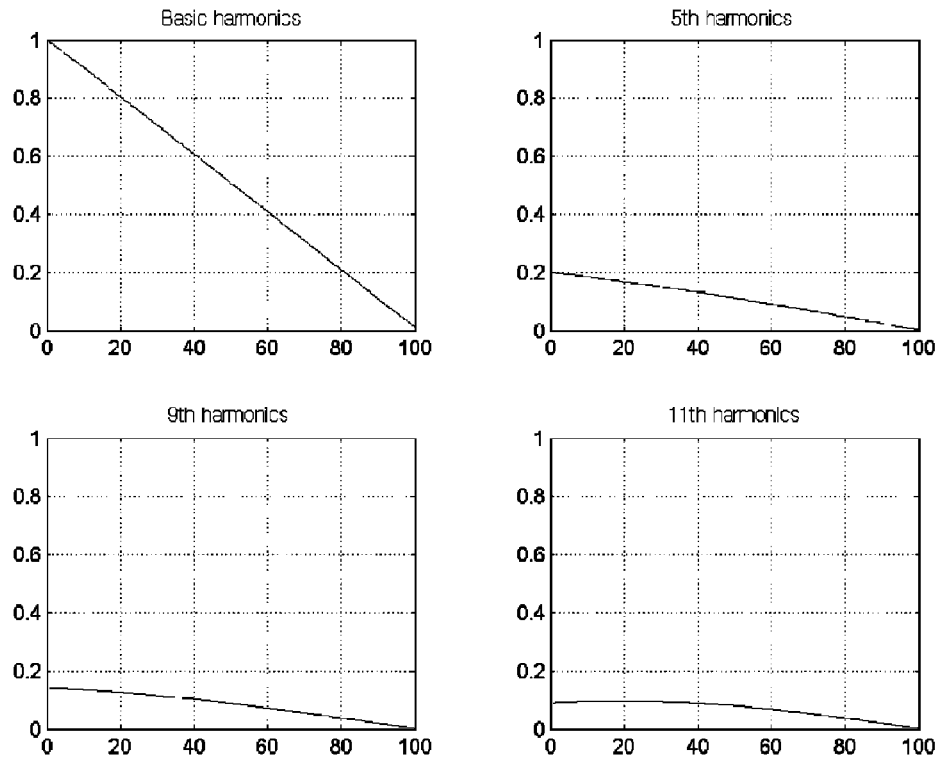
[Fig. 10]
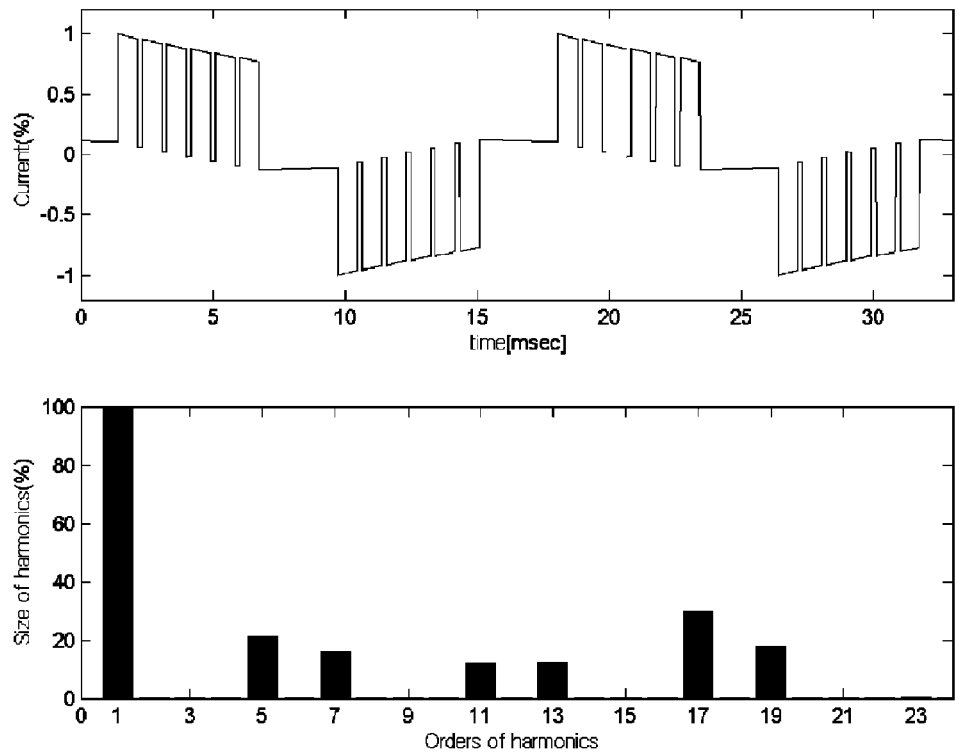

[Fig. 11]
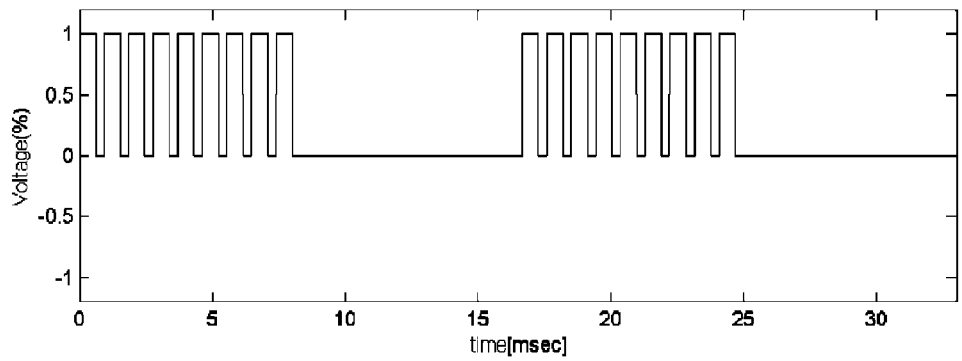
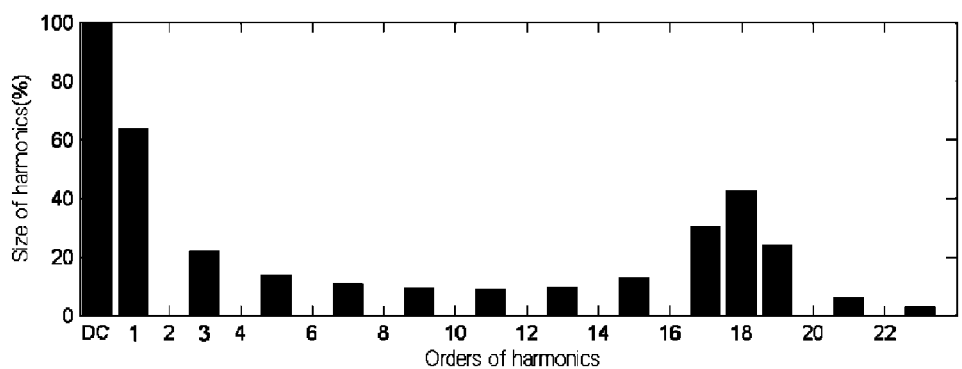
[Fig. 12]
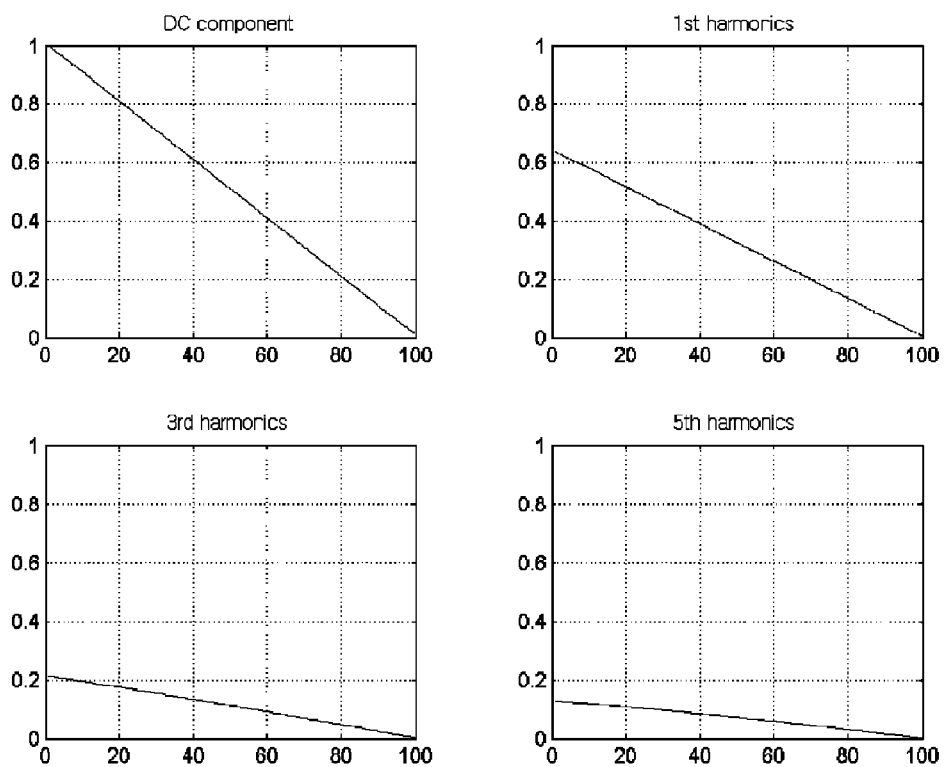

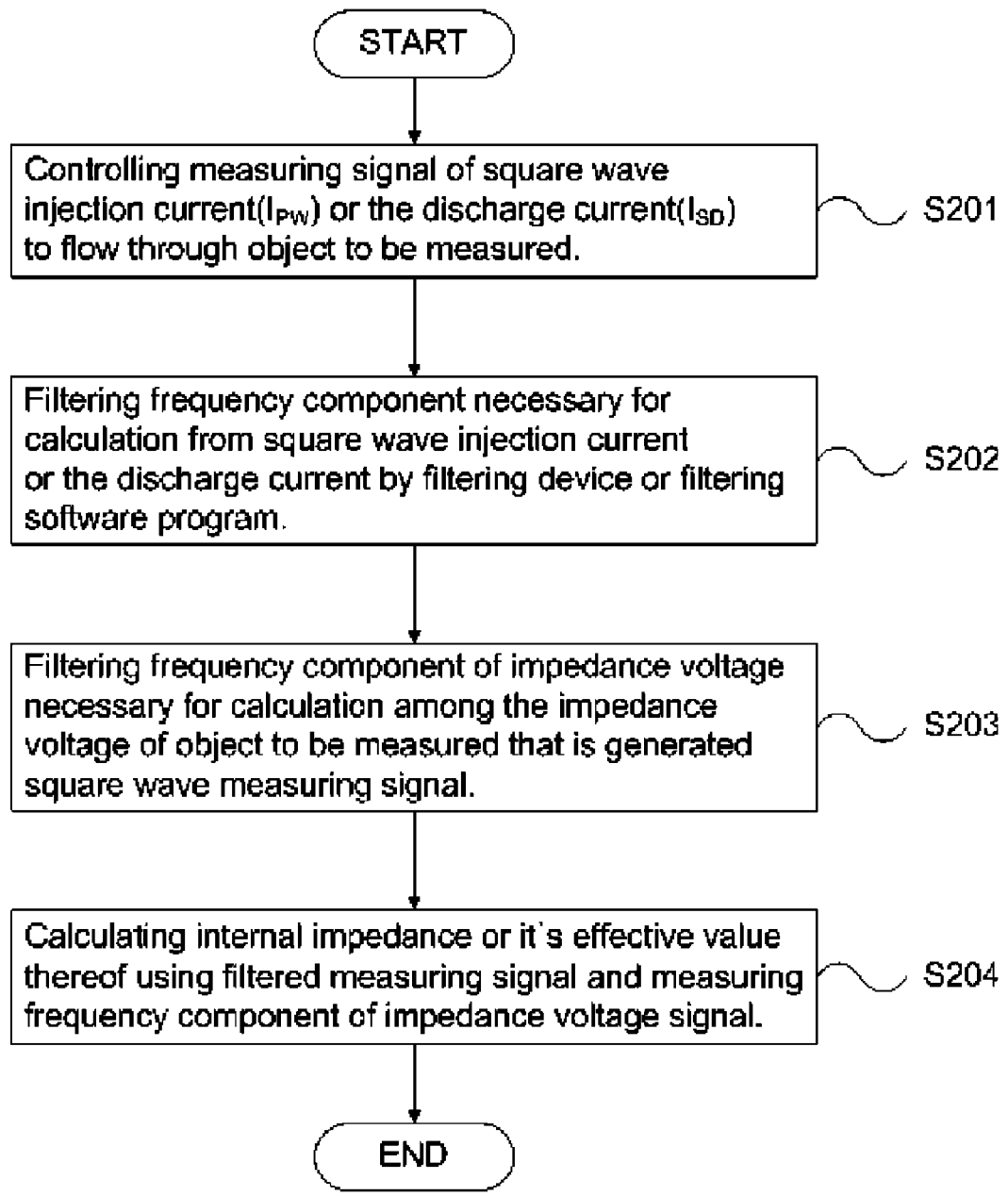
[Fig. 13]

METHOD AND DEVICE FOR MEASURING INTERNAL IMPEDANCE OF STATIONARY BATTERY

TECHNICAL FIELD

The present invention relates to an apparatus for measuring an effective component of internal impedance of a stationary battery and a method thereof and, more particularly, to an apparatus for measuring an effective component of the internal impedance of a stationary battery, which is capable of generating an injection current and a discharge current of a square wave to calculate the internal impedance or the effective value of the internal impedance of a stationary battery or a string of stationary batteries and a method thereof.

BACKGROUND ART

In general, in order to determine the status of deterioration of respective cells that constitute an industrial stationary battery system, the value of internal impedance or conductance is measured. An alternating current (AC) current injection method and a momentary load test; direct current (DC) current measurement are mainly used for measuring the values of the internal impedance and the conductance.

At this time, the value of the internal impedance can be expressed by $Z=R+jX$, the magnitude of the impedance value is calculated by extracting the square root of $R^2+X^2$, and the effective component of the impedance is expressed by the value corresponding the R component. Also, admittance that is the reciprocal of the internal impedance value is represented by $Y=G+jB$ in which G indicates the conductance value.

BACKGROUND TECHNOLOGIES

IEEE 1188-1996
IEEE, pp. 687-694, 1977 and pp. 784-791, 1996
YUASA technology report; No. 72, April 1992
U.S. Pat. No. 6,167,349 (Dec. 26, 2000)
IEEE Paper, pp. 270~271, 1994
(R, Heron, A. McFadden and J. Dunn: Evaluation of Conductance and Impedance Testing on VRLA Batteries for the Stenter Operating Companies" IEEE Conf., INTELEC, pp. 270~271, 1994)

In the AC current injection method, the AC current $I_S$ in the form of a sine wave is inputted to the both terminals of an object to be measured such as a stationary battery to measure a voltage drop component (hereinafter, referred to as an impedance voltage $V_{IS}$) caused by the internal impedance of the stationary battery and thus to measure and calculate the internal impedance value.

That is, as illustrated in FIG. 1, the sine wave AC current $I_S$ is generated by a stationary current source or a voltage source having large internal source impedance to be inputted to the both ends of the terminal of a stationary battery cell whose internal impedance value is measured through an AC 4-terminal network, an impedance voltage signal in the form of a sine wave is measured by the terminal of the stationary battery. The impedance voltage $V_{IS}$ signal is amplified and converted into a pure AC signal through an operational amplifier coupled by a capacitor. The sine wave AC current $I_S$ is converted into a voltage signal through a current sensing means (a shunt or a direct current (DC) transducer) and is amplified by an operational amplifier. The two values are inputted to a digital measuring circuit (an embedded system) including an analog-to-digital (A/D) converter and a central processing unit (CPU).

The effective values of the impedance voltage $V_{IS}$ and the sine AC current $I_S$ and a phase difference $\theta$ between the effective values of the impedance voltage $V_{IS}$ and the sine AC current $I_S$ are calculated by a predetermined operation program installed in the digital measuring circuit. The effective value of the internal impedance value is calculated by the formula of. $V_{IS,RMS} \div I_{S,RMS} * \cos(\theta)$. At this point, $V_{IS,\,RMS}$ (root mean square) is the effective value of the impedance voltage $V_{IS}$ and $I_{S,\,RMS}$ is the effective values of the sine AC current $I_S$.

The injection method is mainly used in Japan or the United States and is referred to as an AC impedance or conductance measuring method.

When the impedance of an unit cell (a stationary battery cell that is not being charged) is measured and calculated by the AC current injection method, relatively precise impedance or internal resistance components can be measured.

However, when the characteristics of the stationary battery cells are to be measured in a floating charge state (in a state where the stationary battery cells are connected to a charger and a load in a normal floating charge state), a high frequency ripple voltage is generated in the voltage of the terminal of the stationary battery by a harmonics ripple current components contained in the charging current. In the case of a large capacity stationary battery, the internal impedance value of the stationary battery is one of very small value in unit of mΩ so that the large capacity stationary battery has to use the sine wave AC current $I_S$ of a limited proper magnitude. Thus, the impedance voltage $V_{IS}$ of the stationary battery cell is several mV, which is much smaller than the harmonics ripple voltage.

Thus, it is possible to calculate a precise value only by excluding the influence of a noise voltage caused by parasitic impedance such as the high frequency ripple voltage caused by the charge current and the reduction in a wiring line voltage of a measuring circuit. It is a demerit that a measuring system becomes complicated and expensive. The Korean Patent Application No. 10-2003-0028521 and 10-2004-0007050 that were filed by the applicant of the present invention disclose a method of excluding the influence of the high frequency ripple voltage when the effective value of the internal impedance is calculated using the principle of measuring the AC impedance or the conductance.

Moreover, a method of excluding the influence of the harmonics ripple voltage $V_{RP}$ caused by the charging current as much as possible, and precisely calculating the internal impedance value or its effective value (resistance components) is used. According to the method, the impedance voltage $V_{IS}$, which is obtained by injecting the sine wave AC current Is of a predetermined frequency to the stationary battery cell to be measured in order to obtain the sine wave impedance voltage, and the AC current is effective integrated for a predetermined integration period.

The momentary load test, DC measurement, is a method referred to as a resistance measurement in the technical standard of IEEE 1188-1996, and is utilized by Abercorp Limited in the United States and widely used now. The momentary load test is a method of calculating the internal resistive impedance based on a momentary variation in the terminals of the stationary battery when a step load current is momentarily applied to the stationary battery cell to be measured.

The basic principle of the momentary load test will be briefly described. Since a momentary voltage drop or a momentary voltage recovery when a step load is applied to or disappeared from the stationary battery cell is generated by the internal resistance of the stationary battery. Using this principle, a current and a cell voltage magnitude just before the load disappears are read and the cell voltage magnitude to be recovered is measured. The internal resistive impedance, required to diagnose whether or not the stationary battery is deteriorated, can be calculated according to the calculation principle of $R_{cell}\, m\Omega=\Delta V/I$ based on the measured data. U.S. Pat. No. 6,167,349 (Dec. 26, 2000), disclosed as a conventional technology document, is a typical example of employing the momentary load test as a basic principle.

In the momentary load test, since a value required in the calculation is mainly a DC voltage signal and has a frequency of lower than those high frequency of the impedance voltage or the AC constant current signal to be measured, the value $\Delta V/I$ of a voltage and a current change that are required in the calculation can be carried out by a low speed or a low resolution A/D converter and can be effectively measured. Therefore, this measuring method needs a relatively simple calculation conditions and can calculate the output value steadily even in a noisy circumstance such as the harmonics ripple voltage generated when charging. However, since the voltage on the terminals of the stationary battery jug is changed in accordance with a charging status and the discharge status when the floating charge is performed, it is difficult to increase the precision of the measured value in comparison to the AC current injection method, and it takes a long time for measuring and calculating.

DISCLOSURE OF INVENTION

Technical Problem

Both the above-described two measuring methods measure through an AC 4-terminal circuit network having a source terminal and a sensing terminal in order to improve a measuring error due to a contact resistance of a measuring probe, the measuring signal is injected or discharged through the source terminal, and the sensing terminal is connected to a terminal of the stationary battery to measure the internal impedance signal value.

However, as shown in FIG. 2, in the case where a large number of stationary battery cells is connected to each other in series or in parallel like a stationary battery system in which a large number of stationary batteries is connected to each other in series to form strings, and further the several strings is connected to each other in parallel, the measuring signal I flowing through the source terminal of the measuring circuit is distributed to another string of stationary battery or a power source (in other words, $I_1 = II_2$). Thus, when the number of the stationary battery units or cells that are connected to each other in series is relatively small, since a magnitude of a current supplied from a current source is different from a current flowing through the stationary battery to be measured, a minute measuring error is generated due to this. Therefore, in order to compensate the error, a correction factor estimated by experience must be applied to analyze the measured value.

At this time, when a large number of stationary battery cells is connected to each other to form a single string of stationary batteries, the error may be increased when measuring in a case where a distribution ratio of the measuring signal I injected or discharged through the source terminal is large. In on-line measuring apparatus, in order to reduce the error, a current supplying cable to supply the measuring signal to every stationary battery cell to be measured must be required. Therefore, costs for installation of the measuring apparatus are increased.

Moreover, since a sine wave voltage source or a sine wave current source higher than at least 1~2 Amperes in order to increase the precision of the measurement, a circuit to generate the sine wave AC current Is becomes complicated and manufacturing cost necessary for realizing the same are increased.

Technical Solution

Accordingly, the present invention has been made keeping in mind the above problems occurring in the prior art, and an object of the present invention is to provide an apparatus for measuring effective value (RMS) of internal impedance of a stationary battery in which in case of a portable measuring circuits, a current sensing means is installed to an output terminal of a current injecting/discharging circuit, a pulse width modulation square wave measuring signal with a predetermined frequency or a pulse amplitude modulation (PAM) square wave measuring signal with a predetermined frequency is injected or discharged through a 4-terminal circuit network to be a PWM or a PAM current signal so that a measuring signal component corresponding to AC current $(I_S)$ that is required for impedance measuring and a measuring signal component corresponding to impedance voltage $(V_{IS})$ are obtained, and a terminal voltage of the stationary battery by a hardware device such as a low pass filter (LPF), a high band pass filter (HPF), or a broadband pass filter or by performing an installed program, and the internal impedance on a measuring frequency component selected by a synchronized detection calculating algorithm or effective value thereof is rapidly and precisely measured without a complicate circuit to generate a sine wave AC current (Is), and a method thereof.

Moreover, it is another aspect of the present invention to provide an apparatus for measuring effective portion of internal impedance of a stationary battery in which, when a large number of stationary battery cells is measured on line, a DC current waveform containing a charging ripple current generated from the string of the stationary battery cells during the charging is detected by using a measuring means and a square wave measuring signal component generated from the current injection/discharge circuit 2 is detected through the current sensing means. A frequency component corresponding to the sine wave AC current (Is) required for measuring, and a fundamental frequency component and a similar frequency component to the same corresponding to the impedance voltage $(V_{IS})$ measured from a terminal voltage of the stationary battery, are obtained by a filtering means or by performing an installed program, and the internal impedance or effective value thereof are precisely calculated by a synchronized detection calculating algorithm based on the waveforms of the measuring frequency components, and a method thereof.

Advantageous Effects

As described above, according to the present invention, when a large number of stationary battery cells is measured on-line, by using a measuring circuit, a direct current (DC) current waveform contains a charging ripple current generated from a string of stationary batteries during the charging is detected by a current sensing means such as a shunt or a DC converter (DC.CT), a measuring signal corresponding to the sine wave AC current $(I_S)$ and the measuring frequency component, required to measure the impedance voltage $(V_{IS})$ generated by the sine wave AC current $(I_S)$, can be obtained, and the internal impedance or effective value (resistance component) thereof can be precisely calculated through the calculating algorithm.

Moreover, according to the present invention, the current sensing means is installed to an output terminal of the current injection/discharge circuit 2 and a pulse width modulation (PWM) measuring signal having an optimally designed frequency is injected or discharged through the 4-terminal circuit network to become the PWM current so that the internal impedance on a corresponding measuring frequency can be measured without a hardware circuit device to generate the sine wave AC current Is.

Further, the fundamental frequency of the square wave current that is injected to or discharged from the stationary battery cell to be measured and the square wave PWM pulse width control frequency is designed optimally to use a common band pass filter circuit. Therefore, since the measuring error due to change of surrounding temperature can be minimized, it is advantageous in economical view.

Moreover, since the current sensing circuit is installed to an adjacent point of a positive bus or a negative bus of the stationary batteries or the string of stationary batteries or an intermediate point of the string of stationary batteries, a measuring signal cabling through the 4-terminal circuit network can be remarkably reduced and their installation is very easy. A circuit is formed to detect the output current of the current injecting and discharging circuit 2 and a charging ripple current $I_{RP}$ simultaneously, so that the impedance voltage $V_{IS}$ component generated by the charging ripple current $I_{RP}$ helps to measure and calculate the internal impedance value. Therefore, the influence from the harmonics ripple voltage $V_{RP}$ can be excluded on the way of calculation.

Moreover, in the case where a large number of battery cells is connected to each other in series or in parallel like a stationary battery system in which a large number of strings to be measured, which are connected to each other in series, is connected to each other in parallel, since the large number of stationary battery cells is precisely measured by the current sensing means connected to the strings that are connected to each other in series by blocks without the measuring signal I distributed to another battery string or another power source side, there is no need to perform the correction factor of the value calculated by experience like the conventional method and the measured value is reliable.

Further, according to the present invention, the current injecting and discharging circuit is designed to generate the square wave injection current or the discharge current having a small section in the circuits so that the size of the devices for measuring and calculating the internal impedance of the stationary battery can be reduced.

BRIEF DESCRIPTION OF THE DRAWINGS

FIG. 1 is a view illustrating a concept of measuring internal impedance by a conventional sine wave AC current injection method;

FIG. 2 is a flowchart illustrating an AC measuring signal of a stationary battery string in which a large number of stationary batteries is connected;

FIG. 3 is a view illustrating a circuit employed in a portable impedance measuring apparatus according to the present invention;

FIG. 4 is a view illustrating a circuit employed in an on-line impedance measuring apparatus according to the present invention;

FIG. 5 is a view schematically illustrating a measuring and calculating circuit of a measuring and calculating device according to the present invention;

FIG. 6 is a view illustrating a frequency spectrum of a square wave current having a conduction angle of 180 degrees;

FIG. 7 is a view illustrating a frequency spectrum of a square wave current having a conduction angle of 120 degrees;

FIG. 8 a view illustrating a frequency spectrum of a square wave current controlled by a pulse width modulation chopping for a 120 degrees conduction period;

FIG. 9 is a graph illustrating variations of magnitudes of a harmonics at respective frequencies in accordance with On-duty variations of a pulse width modulation in FIG. 8;

FIG. 10 is a view illustrating spectra of the harmonics as to respective frequencies in accordance with waveform distortion of a square wave current chopped by the pulse width modulation in FIG. 8;

FIG. 11 is a view illustrating spectra of respective harmonics as to a current waveform chopped by the pulse width modulation for a 180-degrees period and off-pulsed for 180-degrees half-period thereafter;

FIG. 12 is a graph illustrating magnitude variations of the harmonics at respective frequencies in accordance with the variations of the pulse width modulation On-duty in FIG. 11; and FIG. 13 is a flowchart schematically illustrating a measuring and calculating method according to the present invention.

BEST MODE FOR CARRYING OUT THE INVENTION

In accordance with the above aspects, the present invention provides a method of measuring an internal impedance of an object as a stationary battery to be measured or an effective value of the internal impedance, the method comprising: controlling a measuring signal of a square wave injection current ($I_{pw}$) or the discharge current ($I_{sd}$) to flow through the object; filtering a frequency component necessary for measuring among the frequency components of a square wave measuring signal by a filtering means or by carrying out a filtering program; filtering the frequency component of an impedance voltage generated by the square measuring signal and necessary for measuring among an impedance voltage signal of the object to be measured; and calculating the internal impedance or the effective value of the internal impedance by using the said filtered measuring signal and the said frequency component of the impedance voltage signal.

Moreover, the measuring signal of the square wave injection current ($I_{pw}$) or the discharge current ($I_{sd}$) is controlled by a pulse width modulation or a pulse amplitude modulation to have a conduction angle of 120 degrees or 180 degrees, or is controlled by a large number of sequential pulses by a pulse width modulation of being with a conduction period of 120 degrees or 180 degrees.

Moreover, the fundamental frequency of the square wave measuring signal is determined to be identical to any one of 0.5 times, integer times, and (n+0.5) times, and the sixth harmonics of a frequency of commercial power source, and times of 10 Hz.

The measuring signal may be substituted by a voltage waveform generated by controlling a voltage source by the pulse width modulation or the pulse amplitude modulation.

In accordance with another aspect, the present invention provides an internal impedance measuring device of a stationary battery for measuring an internal impedance of respective stationary battery cells comprising a large number of stationary batteries or an effective value of the internal impedance, the device comprising: a current injecting and discharging circuit (2) to make a measuring signal of a square wave injection current ($I_{pw}$) or discharge current ($I_{sd}$) flow through the stationary battery cells of respective strings (31a~31n) of stationary batteries; current sensing means (5a~5n), installed to respective strings (31a~31n) of the stationary batteries, to detect an AC current ($I_B$) containing the measuring signal of the square wave injection current ($I_{pw}$) or discharge current ($I_{sd}$) that flows through the respective strings (31a~31n) of the stationary batteries; a switching means (20) to switch the AC current ($I_B$) detected by the current sensing means (5a~5n) and a current sensing means (4) installed to an output end of the current injecting and discharging circuit (2) to a measuring and calculating circuit (1); a current connecting means (21) to switch the AC current ($I_B$) including the square wave injection current ($I_{pw}$) or discharge current ($I_{sd}$) to the respective strings (31a~31n) of the stationary batteries; and the measuring and calculating circuit (1) to calculate the internal impedance or an effective value of the internal impedance using the measuring frequency component of a measuring current signal and the measuring frequency component of an impedance voltage ($V_{IS}$) signal of the battery cells.

Moreover, the current injecting and discharging circuit (2) is controlled by a pulse width modulation or a pulse amplitude modulation to generate the measuring current signal of the square wave injection current ($I_{pw}$) or discharge current ($I_{sd}$), and generate the measuring current signal of the square wave injection current ($I_{pw}$) or discharge current ($I_{sd}$) to be controlled by the pulse width modulation with a conduction angle of 120 degrees or 180 degrees, or controlled by the pulse width modulation with a large number of sequential pulses whose total conduction angle is 120 degrees or 180 degrees.

Moreover, fundamental frequency of the square wave measuring signal is determined to be identical to any one of 0.5 times, integer times, and (n+0.5) times, and a sixth harmonics of a frequency of a commercial power source, and times of 10 Hz.

The measuring signal may be replaced with a voltage waveform generated by controlling a voltage source by the pulse width modulation or the pulse amplitude modulation.

The present invention further comprises a charger (3) to charge the string of the stationary batteries including a large number of stationary batteries, wherein the measuring and calculating circuit (1) calculates the internal impedance or the effective value of the internal impedance by using an impedance voltage ($V_{IS}$) component generated by a first harmonics or a lower order harmonics of a charging ripple current ($I_{RP}$) applied from the charger (3).

At that time, the current injecting and discharging current (2) generates the injection current ($I_{pw}$) or discharge current ($I_{sd}$) such that the fundamental frequency of the measuring signal is in phase with the first harmonics or the lower order harmonics of the charging ripple current ($I_{RP}$) so that the impedance voltage ($V_{IS}$) signal component is generated by the charging ripple current ($I_{RP}$) with the same frequency as a fundamental frequency of the AC current ($I_B$) flowing through the respective strings (31a~31n) of the stationary batteries, and by using those, the measuring and calculating circuit (1) calculates the internal impedance and the effective value.

Moreover, in accordance with another aspect, the present invention provides an internal impedance measuring device of a stationary battery for measuring an internal impedance of respective stationary battery cells or an effective value of the internal impedance, the device comprising: a current injecting and discharging circuit (2) to generate a measuring signal of a square wave injection current ($I_{pw}$) or discharge current ($I_{sd}$) to measure the internal impedance or the effective value of the stationary battery cells; a current sensing means (4) to detect the measuring signal of the square wave injection current ($I_{pw}$) or discharge current ($I_{sd}$) flowing through the stationary battery cells; and a measuring and calculating circuit (1) to calculate the internal impedance or the effective value of the internal impedance using the measuring signal and a measuring frequency component of an impedance voltage ($V_{IS}$) of the stationary battery cells.

The measuring and calculating circuit (1) comprises: a filtering means (10) to filter the fundamental frequency component and the measuring signal of a similar frequency component from the AC current ($I_B$); a differential amplifying circuit (11) to divide or amplify the terminal voltage (Vp) of a battery jug; a direct current coupling circuit (12) to filter only the impedance voltage ($V_{IS}$) of the stationary battery cells from the terminal voltage (Vp); filtering means (13) to filter the fundamental frequency component and the similar frequency component from the impedance voltage ($V_{IS}$) necessary for the measurement; and an analog/digital (A/D) converter (15) to convert an analog signal filtered by the filtering means (10 and 13) into a digital signal.

The function of the above filter means, in general, can be realized by adapting only a hardware filter circuit, but is not limited to this, it is possible that the function of the filtering means can be supported by performing a filtering program in the measuring and calculating device or can be substituted only by performing the filtering program in order to fulfill maximized a filtering effect.

Moreover, the measuring and calculating circuit (1) further comprises a period reading circuit (18) to determine a period of the fundamental frequency component filtered by the filtering means (13), and a direct current coupling circuit (9) to filter pure alternating current component of the AC current ($I_B$) containing the injection current ($I_{pw}$) or the discharge current ($I_{sd}$).

These and/or other aspects and advantages of the invention will become apparent and more readily appreciated from the following description of the embodiments, taken in conjunction with the accompanying drawings.

FIG. 3 is a circuit diagram illustrating an internal impedance measurement applied to a portable impedance measuring apparatus, FIG. 4 is a circuit diagram illustrating an internal impedance measurement applied to an on-line measuring apparatus capable of automatically scanning a large number of stationary battery cells being with floating-charge to calculate an internal impedance value, and FIG. 5 is a schematic circuit diagram illustrating a measuring and calculating circuit of a measuring and calculating device according to the present invention.

Firstly, the apparatus for measuring and calculating internal impedance of a stationary battery according to the present invention includes a measuring and calculating circuit 1 having an analog/digital (A/D) converter 15 and a micro-processor unit (MPU), a current injecting and discharging circuit 2 to control and generate a flowing of a square wave pulse width modulation (PWM) current or a square wave pulse amplitude modulation (PAM) current, and a current sensing means 4 or 5a~5n.

As illustrated in FIG. 3, in a case when the measuring and calculating device according to the present invention is realized by and is used as a portable measuring apparatus, the current sensing means 4 is connected to an output side of the current injecting and discharging circuit 2 and the current injecting and discharging circuit 2 generates the square wave PWM injection current or the square wave PAM injection current $I_{pw}$ through a source terminal or discharges the stationary battery such that a discharge current $I_{sd}$ flows. The current sensing means 4 measures a magnitude of the square wave injection current $I_{pw}$ or the square wave discharge current $I_{sd}$ and inputs the measured magnitude to the measuring and calculating circuit 1.

Moreover, as illustrated in FIG. 4, in a case when the measuring and calculating technology according to the present invention is utilized in the form of on-line type, the current sensing means 5a, 5b~5n are installed between a point adjacent to a positive bus or a negative bus of the stationary batteries and the respective strings 31b~31n of the stationary batteries connected to each other to form a circuit such that the AC current $I_B$ flowing to the battery units or cells to be measured in the respective strings 31b~31n of the stationary batteries can be directly detected. The AC current $I_B$ is corresponded to the measuring signal I in FIG. 2 and includes a charging current $I_{ch}$ supplied by charging, a charging ripple current $I_{RP}$ generated when charging, and the square wave PWM or PAM injection current $I_{pw}$ injected or the discharge current $I_{sd}$ discharged through the source terminal.

When the current injecting and discharging circuit 2 creates the injection current $I_{pw}$ or makes the discharge current $I_{sd}$ flow through the source terminal by discharging the stationary batteries, the PWM or PAM controlling technique is employed to have to control a magnitude of an output current of the square wave injection current $I_{pw}$ or the square wave discharge current $I_{sd}$ by the PWM or the PAM-control method such that the magnitude of the injection current $I_{pw}$ or the discharge current $I_{sd}$ is restricted to a predetermined magnitude and flows in accordance with the characteristics of the stationary battery cells.

Here, in order to minimize a ratio of the AC current $I_B$ to be distributed to other strings 31a~31n of the stationary batteries or to the power source of a charger 3, entire stationary batteries are divided into at least two string groups by considering the number of the cells of the stationary batteries or the strings, and the current sensing means 5a~5n are installed to the respective string groups. In this case, since a line inductor 6a or a DC inductor 6b exists on output line of the charger 3, the phenomenon that the AC current $I_B$ is distributed to the other strings of the stationary batteries or the charger can be sufficiently minimized even when the stationary batteries are divided into two strings 31a and 31b. Therefore, an error generated due to the current distribution can be eliminated in comparison to such a way that the current sensing means is installed to only the output terminal of the current source or the conventional voltage source as conventionally used.

Moreover, in a case when the charging current $I_{ch}$ to charging the stationary batteries by the charger 3 is supplied, since the charging current $I_{ch}$ includes the DC component and the ripple current component, the charging current $I_{ch}$ becomes $I_{ch}=I_{DC}+I_{RP}$ and the AC current $I_B$ including the charging ripple current $I_B$ flows through the stationary battery cells 31a~31n. The AC current $I_B$ is detected by the current sensing means 5a~5n and inputted to the measuring and calculating circuit 1.

In the AC current $I_B$, the PWM or PAM square wave injection current $I_{pw}$ or the PWM or PAM square wave discharge current $I_{sd}$ is generated from the current injecting and discharging circuit 2 and overlapped in the charging ripple current $I_{RP}$. Therefore, the AC current $I_B$ can be expressed by $I_B=I_{DC}+I_{RP}+I_{pw}$ or $I_B=I_{DC}+I_{RP}I_{sd}$. When the AC current $I_B$ flows, the impedance voltage $V_{IS}$ induced by the AC current $I_B$ is generated in the terminal voltage of the stationary batteries and is inputted to the measuring and calculating circuit 1 by a stationary battery cell selecting means 22.

Moreover, the square wave PWM or PAM injection current $I_{pw}$, the square wave PWM or PAM discharge current $I_{sd}$, or the Ac current $I_B$ is filtered by a filtering means 10 in the measuring and calculating circuit 1 so that an AC current component of a measuring frequency necessary for calculating the internal impedance is obtained and an impedance voltage component of a measuring frequency necessary for the calculating among the impedance voltage $V_{IS}$ signals contained in the terminal voltage Vp of the stationary batteries can be easily obtained by a filtering means constructed in the form of hardware.

In this case, waveforms corresponding to the injection current $I_{pw}$, the discharge current $I_{sd}$, the AC current $I_B$, the impedance voltage $V_{IS}$ are calculated into waveforms of components with a predetermined fundamental frequency by carrying out Fourier series transform so that the AC current component of the predetermined fundamental frequency necessary for calculating the internal impedance can be obtained even when never using the filtering means 10 and 13. However, in order to precisely compute the waveforms of the respective components of the fundamental frequency by the Fourier series transform, a high-speed A/D converter is needed and the amount of the calculating is increased, and then it takes a lot of time for the calculating so that the effectiveness of the Fourier series transform cannot be fulfilled properly.

However, when the PWM or PAM square wave injecting current $I_{pw}$ or the PWM or PAM square wave discharge current $I_{sd}$ is generated by using the topology proposed in the present invention, the respective fundamental frequency components among the impedance voltages $V_{IS}$ becomes relatively large signals in comparison to other harmonic components, the effective impedance value corresponding to the components of the fundamental frequency can be calculated using the synchronized detection calculating algorithm including the filtering program that is proposed in the present invention without the Fourier series transform or the filtering means to eliminate (filter) frequency component of a specific broadband.

Values of the above two components are inputted to the A/D converter 15 of an embedded system including the A/D converter 15 and MPU converts them into digital values, and a calculating program installed in the embedded system is executed to compute the impedance or the effective values, corresponding to the fundamental frequencies of the AC current $I_B$, the square wave injection current $I_{pw}$, or the discharge current $I_{sd}$ in accordance with the principle of a formula, $m\Omega=V_{IS,RMS}/I_{S,RMS}*\cos(q)*10^3$ A measuring frequency required in the measuring and calculating operation includes the fundamental frequency component necessary for measuring and a frequency component similar to the same, and the MPU, installed in the embedded system 16, is formed to control the generation of the frequency components in order to avoid the complication of the calculating program.

Moreover, a switching means 20 is connected to the measuring and calculating circuit 1, is associated with a current connecting means 21 to detect the AC current $I_B$ signal to be injected or discharged from the current sensing means 4 and 5a~5n to apply the detected signal to the measuring and calculating circuit 1, and is turned on/off by the MPU. In this case, the switching means 20 may be implemented by an analog switch and others.

MODE FOR THE INVENTION

Hereinafter, the above-described embodiments of the present invention will be described in detail with reference to related drawings.

Firstly, as illustrated in FIG. 3, since a circuit employed in the portable measuring device must be applied manually by contacting the probe of the AC 4-terminal network to a post of the stationary battery cell to be measured, by considering convenience of the measurement, the square wave PWM or PAM injection current $I_{pw}$ or the square wave PWM or PAM discharge current $I_{sd}$ flows through the probe of the AC 4-terminal network and the current sensing means 4 to detect the injection current $I_{pw}$ and the discharge current $I_{sd}$ is installed to the output terminal of the current injecting and discharging circuit 2.

Moreover, as illustrated in FIG. 4, a circuit employed in on-line measuring apparatus can detect the AC current $I_B$ flowing through the output terminal of the current injecting and discharging circuit 2 by installing the current sensing means 5a~5n between connecting bus bar or cable of the positive terminals or negative terminals of the stationary batteries or the respective strings of the stationary batteries, and can detect the injecting current $I_{pw}$ or the discharge current $I_{ch}$ by installing the current sensing means 4 to the output terminal of the current injecting and discharging circuit 2. In this case, the AC current $I_B$ is formed by the ripple current $I_{RP}$ in the charging current $I_{ch}$ and the square wave PWM or PAM injection current $I_{pw}$ or the square wave PWM or PAM discharge current $I_{sd}$.

FIG. 5 illustrates a preferable embodiment of the measuring and calculating circuit 1, and the AC current $I_B$, and the square wave injection current $I_{pw}$ or the square wave discharge current $I_{sd}$ are measured by a shunt, or the current sensing means 4 and 5a~5n as a DC current sensing means in the form of a hall sensor or a shunt equivalent to resistors. In this case, the square wave injection current $I_{pw}$ or the square wave discharge current $I_{sd}$ may include the DC charge current component.

Moreover, the AC current $I_B$, the square wave injection current $I_{pw}$ or the square wave discharge current $I_{sd}$, obtained by the current sensing means 4 and 5a~5n, is buffered or amplified by a differential amplifying circuit 8. The DC charge current component of the signal amplified at the differential amplifying circuit 8 is come to be eliminated by a DC coupling circuit 9 and only a measuring frequency component is obtained by the filtering means 10 and is inputted to the A/D converter of the embedded system.

When the injection current method is employed in the circuit for portable measuring apparatus in FIG. 3 so that the current to be injected only includes the AC current component or the DC component is minute, the DC coupling circuit 9 is not necessary.

In another embodiment of the present invention, when the DC current component in the AC current $I_B$ and the square wave injection current $I_{pw}$ or discharge current $I_{sd}$ are minute, the DC current component can be eliminated at the filtering means 10 without the DC coupling circuit 9 or during the calculation of the effective impedance value after the A/D conversion of the current signal.

Moreover, as the AC current $I_B$ including the injection current $I_{pw}$ or the discharge current $I_{sd}$ flows through the terminal voltage Vp of the stationary battery cells, the impedance voltage $V_{IS}$ is obtained to be overlapped over an internal voltage $V_E$ as an electromotive force of the stationary battery. In this case, the terminal voltage Vp is converted into a proper signal level in differential amplifying circuit 11 having a voltage distributing means or an input circuit insulating means, and after that, the DC component is eliminated by another DC coupling circuit 12. And operational amplifier with resistors and capacitors can generally implement the DC coupling circuit 12.

According to an embodiment, in the impedance voltage $V_{IS}$ signal converted into an AC level, only the frequency similar to the fundamental frequency component of the AC current $I_B$ to be filtered by another filtering means 13 identical to the filtering means 10, and is amplified to an optimal signal level and inputted to the A/D converter 15 in amplifying circuit group 14. In order to measure the voltage of stationary battery cell, the output of the differential amplifying circuit 11 is inputted to the A/D converter 15 via a DC filter 17.

The measured frequency component of the AC current $I_B$ and a measured frequency component of the impedance voltage $V_{IS}$ signal amplified by the amplifying circuit group 14 are converted into digital signals by the A/D converter 15, and the effective component value of the internal impedance is calculated by carrying out a calculating algorithm of a microcontroller unit (MCU). Since inputs of the A/D converter 15 includes a large number of analog multiplexers (MUX), the measured frequency component of the AC current $I_B$, the measured frequency component of the impedance voltage $V_{IS}$ signal, and a signal acquired corresponding to the voltage of the stationary battery cell are all inputted to the MUX as the input channel of the A/D converter 15.

The differential amplifying circuit 11 to measure the impedance voltage $V_{IS}$ signal of the stationary battery cell, the DC coupling circuit 12, and the filtering means 10 and 13 may implement another embodiment with reference to Korean Utility Model Application No. 20-2003-0037800 and Korean Patent Application No. 10-2004-0099962. Moreover, with reference to the technical principle disclosed by Korean Patent Application No. 10-2003-0025823, another embodiment of the embedded system 16 including the amplifying circuit group 14 and the A/D converter 15.

Moreover, in general, the filtering means 10 and 13 are designed to have a property of a narrow band pass filter with a very narrow bandwidth which has a single operational amplifier so that a amplitude gain is obtained at the resonance frequency f assigned, and designed such that a attenuation characteristics with respect to a specific frequency other than the fundamental frequency is maximum so that the influence from the harmonic noise or the charging ripple current can be minimized when calculating the impedance.

However, in the narrow band pass filter having the above-described property, since the characteristics of resistors and capacitors that are the component parts of filter circuits are varied by an ambient temperature drift and a designed value of the resonance frequency $f_r$ is differed accordingly so that the filtering gain of a frequency signal to be obtained may be attenuated, an measuring error on the internal impedance value occurs when the ambient temperature is varied.

Therefore, although the designed value of the resonance frequency $f_r$ is varied over ±10% due to the ambient temperature varied or affected by emitted heat from the components used in circuit, broad bandwidth B of the filtering means 10 and 13 should be designed such that the attenuation characteristics with respect to the fundamental frequency of the impedance voltage $V_{IS}$, the AC current $I_B$, the square wave injection current $I_{pw}$, or the square wave discharge current $I_{sd}$ can be maintained approximately at zero (0).

As an embodiment, when the fundamental frequency is designed to be 720 Hz, the resonance frequency $f_r$ must be designed equal to be 720 Hz and make the attenuation with respect to the frequency range between 660 Hz to 780 Hz as ±5% of the bandwidth of the resonance frequency $f_r$ to be completely zero (having maximal gain) so that the influence of the variation of the ambient temperature can be reduced even when the designed value of the resonance frequency $f_r$ is varied about ±5% due to the ambient temperature variation.

In other words, a broadband pass filter BPF designed such that a low band cut-off frequency $f_L$ and a high band cut-off frequency $f_H$ to be 600 Hz and 840 Hz respectively, can effectively eliminate a noise signal caused by the charging ripple current and inductive noise affects in comparison to a narrow band pass filter having a very narrow bandwidth and can be operated steadily regardless of the ambient temperature variation.

In an embodiment, only a frequency component corresponding to the fundamental (fundamental frequency component) and a frequency component similar to the same among the impedance voltage $V_{IS}$ component, the square wave injection current $I_{pw}$, and the square wave discharge current $I_{sd}$ are filtered so that the internal impedance or an effective value of the internal impedance corresponding to the fundamental frequency component is easily calculated in accordance with the effective value calculating formula.

Moreover, as described above, although only a component corresponding to the fundamental frequency can be obtained by calculating the waveforms of the respective measuring frequency components precisely through the Fourier series transform, in this method, a high speed A/D converter is needed, the amount to be calculated is increased, time for the calculation is remarkably increased so that it is actually difficult to obtain the effectiveness of the Fourier series transform. Furthermore, when the square wave injection current or discharge current in the form of PWM or PAM-control that is properly designed at need, since in the impedance voltage $V_{IS}$ the fundamental frequency component necessary for measurement is greater than that of other harmonics, the measuring frequency component can be precisely obtained using the filtering means or the synchronized detection calculating algorithm proposed by the present invention without the Fourier series transform. Therefore, the effective component of the corresponding impedance can be effectively calculated.

FIGS. 6 to 12 are views illustrating frequency spectra of respective harmonic frequencies with respect to various waveforms of the square wave current and the square wave voltage that are generated in the current injecting and discharging circuit 2, in which horizontal axes represent order of the respective harmonics and vertical axes represent magnitudes of the respective harmonics by %.

Firstly, FIG. 6 is a view illustrating frequency spectra of respective harmonic frequencies of a square wave injection current $I_{pw}$ having conduction angles of 180 degrees at a former half period and a later half period. Moreover, frequency spectra of respective harmonics when a discharge current $I_{sd}$ having a conduction angle of 180 degrees flows for the former half period has the same form, but further include the DC current component.

In this case, the frequency spectrum with respect to the sine wave current has only the fundamental component, however, the square wave current having a conduction angle of 180 degrees includes odd order harmonics such as a third harmonics having about 34% magnitude, a fifth harmonics having about 20% magnitude, a seventh harmonics, a ninth harmonics, and eleventh harmonics in comparison to the magnitude of the fundamental frequency component and the magnitudes are decreased as the order is increased.

Moreover, as another example, even the respective frequency spectra of a square wave injection current $I_{pw}$ having a conduction angle of 90 degrees also include all the odd order harmonics including the third harmonics and the fifth harmonics, whose magnitudes are similar to those of the frequency spectra of the respective harmonics with respect to the square wave injection current $I_{pw}$ having a conduction angle of 180 degrees in FIG. 6.

FIG. 7 is a view illustrating the respective frequency spectra of a square wave current or a square wave voltage having a conduction angle of 120 degrees and including odd order harmonics (excluding three time order) such as about 20% fifth harmonics, about 15% seventh harmonics, the eleventh harmonics, and the thirteenth harmonics which are smaller as their orders are increased in comparison to the magnitudes of the fundamental components.

FIG. 8 illustrates magnitudes of the fundamental wave and the respective harmonics (spectrum of the harmonics) by percentage (%) with respect to the square wave PWM injection current $I_{pw}$ having a conduction angle of 120 degrees and generating six sequential pulses by pulse width modulation (PWM) chopping (cutting) control with a 120 degrees conduction period. Moreover, when the current injecting and discharging circuit 2 is specially controlled to generate the discharge current $I_{sd}$ in the form as illustrated in FIG. 8, the other harmonics ratio with respect to the generated discharge current $I_{sd}$ is identical to that of the square wave PWM injection current $I_{pw}$ in FIG. 8 and further includes only the DC discharge current component additionally.

FIG. 9 illustrates variation of magnitudes of the respective harmonic frequencies in accordance with a pulse width variation by a pulse width on-duty control of the PWM-chopped square wave current in FIG. 8 by percentage (%). The magnitude of the fundamental frequency is decreased approximately proportional as the conduction period of the PWM on-duty control is reduced. Moreover, it can be understood that the third harmonics is always 0 (zero, never generated) and the magnitudes of the harmonics in the order of the fifth, the seventh, and the eleventh are decreased.

Furthermore, when the same waveforms of voltages as the waveforms of the respective square wave currents illustrated in FIGS. 6 to 8 are supplied to the stationary batteries, the waveforms of the currents flowing through the stationary batteries are distorted by capacitor components of the stationary batteries.

FIG. 10 illustrates the harmonics spectra of waveforms of respective frequencies flowing into the stationary batteries when the same voltage waveforms as the PWM-chopped current waveforms in FIG. 8, and it represents magnitude of the fundamental wave and the respective harmonic currents by percentage (%), and is very similar to the result of FIG. 8. Therefore, in case of the voltage waveforms like those of current in FIG. 8 are generated, the measuring signals are supplied to the stationary batteries, and similar spectra of harmonic current can be obtained.

In still another embodiment, like illustrated in FIGS. 6 and 7, since the stationary batteries and the current injecting and discharging circuit are needed to be protected from an over current state when the square wave injection current $I_{pw}$ or discharge current $I_{sd}$ such as the square wave current or voltage waveform having a predetermined conduction angle such as 90 degrees or 120 degrees flows through the stationary batteries, the magnitude of the current should be limited. Also, the square wave injection current $I_{pw}$ or discharge current $I_{sd}$ can be controlled utilizing the pulse amplitude modulation (PAM) control principle.

As illustrated in FIG. 9, when the 120 degrees conduction period is PWM-chopped into several intervals, the magnitude of the fundamental wave can be adjusted from 0% to 100% in proportion to the width of the On-conduction period of PWM pulses. Moreover, since, although the characteristics of the filtering means 10 and 13 are designed to have broadband pass property by considering the ambient temperature variation, the respective harmonic components never include the third harmonics, the attenuation rate of the fundamental frequency can be obtained to be approximate 0.

Furthermore, it is advantageous that the harmonics ratio of the magnitude of lower order harmonics such as the fifth harmonics becomes smaller as the number of the sequential pulses is increased when the frequency of the PWM pulse is increased during the 120 degrees conduction period. However, since switching loss is increased when switching the frequency of the PWM pulse into high chopping frequency by using presently used switching means (for example, FET), the frequency of the PWM pulses must be set to an optimal value by considering this technical issue when designing the current injecting and discharging circuit 2. By doing so, the frequency of the PWM pulses can be determined from 10 kHz to 40 kHz by using the presently used power switching devices.

On the other hand, in the on-line measuring apparatus of a detailed embodiment of the present invention, the fundamental frequency of the square wave injection current $I_{pw}$ having 120 degree conduction angle is set to 360 Hz (300 Hz in a case when frequency of a commercial power is 50 Hz), namely, 6 times of frequency of the commercial power source and is PWM-controlled into several to tens in the 120 degree conduction period so that the magnitude of the sine wave current signal of the fundamental frequency as 360 Hz or 300 Hz can be freely adjusted from 0% to 100%. Therefore, due to the PWM-chopping control, the current injecting and discharging circuit 2 can be controlled to have the stationary current characteristics.

FIG. 11 is a view illustrating a waveform of the discharge current $I_{sd}$ that is PWM-chopped (for example, On-duty is about 65%) for the 180 degrees former half period, and turned off for the half period thereafter, and illustrates magnitudes of the fundamental wave that is PWM-chopped to 9 pulses for the 180 degrees former half period and respective harmonic currents by percentage (%) as an embodiment. The total harmonic distortion of a first harmonics as the fundamental frequency is about 63% of that of the discharging DC current and the harmonic ratio of a third harmonics is about 33% of that of a second harmonics. Here, when the number of the PWM chopping for the 180 degree former half period is increased, the harmonic ratio % of the lower order harmonics such as the third harmonics is decreased. However, since the switching loss is increased when being switched to higher frequency, the optimal PWM-chopping frequency must be selected as described above.

FIG. 12 illustrates a variation of magnitudes of the harmonics at respective frequencies by percentage (%) in accordance with the variation of the PWM On-duty of the square wave discharge current that is PWM-hopped in FIG. 1. A magnitude of the fundamental wave is proportionally decreased as the On-conduction period of the PWM On-duty is decreased, similar to the case of FIG. 9. Moreover, it can be understood that the second harmonics is always 0 (zero, never generated) and the magnitude of the harmonics in the order of the fifth, the seventh, and the eleventh are decreased.

In an embodiment of the present invention, the waveform of the 360 Hz (six times frequency of commercial power source) square wave current having 120 degrees in FIG. 8 includes a fifth harmonics of 1,800 Hz, a seventh harmonics of 2,520 Hz, a eleventh harmonics of 3,960 Hz, and higher order harmonics in addition to the fundamental frequency of 360 Hz. Moreover, it can be understood that, in the waveform of the square wave discharge current $I_{sd}$, like that illustrated in FIG. 11, the second harmonics is always 0 (zero, never generated), the contents of the third harmonics of 1,080 Hz is about 33% of that of the fundamental harmonics, and the magnitudes of the harmonics are decreased in the order of the fifth harmonics and the seventh harmonics.

Therefore, in the waveforms of the square wave current having a 120-degree conduction period in FIG. 8 and the square wave discharge current $I_{sd}$ in FIG. 11, undesired harmonics can be easily eliminated by a band pass filter circuit having a broadband pass filter property as a low band cut-off frequency $f_L$ lower than about 300 Hz or a high band cut-off frequency $f_H$ higher than 480 Hz.

Moreover, although the resonance frequency $f_r$ varies more than +10% as a result of change in the properties of the filter components due to the temperature variation, the broadband pass filter designed to suit a relative broadband as described above has a characteristics of a relative broadband pass filter as described above. Therefore, the fundamental frequency 360 Hz passes without being attenuated and never be influenced from the temperature variation due to this principle.

As still another embodiment, in a case where the frequency of the commercial power source is 50 Hz, the same result of effect as a band pass filter circuit corresponding to the same times order harmonics can be obtained using the same technical topology.

Further, when the stationary battery is operated in the floating-charge state, since the charging ripple current $I_{RP}$ is applied to the stationary battery to be measured from the charger 3, the harmonics ripple voltage due to the charging ripple current is mixed with the impedance voltage $V_{IS}$ at the terminal voltage of the stationary battery.

The ripple voltage component generated by the charging ripple current $I_{RP}$ is differed by rectifying method of the charger but includes several order harmonics ripple components. When ideal waveforms of output voltages from a three phase three pulses rectifying circuits, a six phase six pulses rectifying circuits, and a phase control rectifying circuits are analyzed by a simulation program and magnitudes of respective harmonics ripple voltages contained in the waveforms of the output DC voltages are measured, the respective harmonics includes times of number of pulses of the rectifying circuits and the magnitude of the respective harmonics are decreased as the order is increased. For example, 2, 4, 6, 8, order harmonics ripple voltages $V_{RP}$ are included in a single phase rectifying circuit, 3, 6, 9, 12, order harmonics ripple voltages $V_{RP}$ are included in a three phase and three pulse rectifying circuits, and 3, 6, 9, 12, order harmonics ripple voltages $V_{RP}$ are included in a six phase six pulses rectifying circuits. The respective ripple voltages $V_{RP}$ generate ripple current $I_{RP}$ harmonics when charging.

When the floating-charge current flows through the stationary battery of the string of the stationary battery by the charger 3, the charging ripple current $I_{RP}$ due to the harmonics ripple voltage $V_{RP}$ contained in the charging current $I_{ch}$ flows through the stationary battery, and the charging ripple current $I_{RP}$ is contained in the AC current $I_B$ to be detected by the current sensing means 5a~5n. Therefore, during the floating charge the AC current $I_B$ flows through the stationary battery cell to be measured, the harmonic component of the charging ripple current $I_{RP}$ is contained in the AC current $I_B$ and the internal impedance voltage signal corresponding to the harmonics of the charging ripple current $I_{RP}$ is induced in the terminal voltage Vp of the stationary battery cell to be measured. When a lower order harmonics among the charging ripple current $I_{RP}$ contained in the AC current $I_B$ signal is large sufficient to induce the impedance voltage $V_{IS}$ signal, a specific frequency component necessary for the measurement among the impedance voltage $V_{IS}$ generated by the charging ripple current $I_{RP}$ can be obtained by the filtering means 13, and the internal impedance corresponding to those can be measured and calculated by the measuring and calculating circuit 1.

As such, when the current sensing means 5a~5n are installed to detect the AC current $I_B$ containing the charging ripple current $I_{RP}$ harmonic frequency, the frequency component corresponding to the measuring signal such as the sine wave AC current Is and the internal impedance voltage $V_{IS}$ generated by the frequency component can be obtained. Therefore, an additional current injecting and discharging circuit 2 is not necessary so that the on-line measuring apparatus can be simply designed.

Moreover, when designing a commercial product, the current injecting and discharging circuit 2 is installed as an subsidiary function so that the internal impedance measuring means can be systemically controlled and is driven when the magnitude of the measuring frequency component of the AC current $I_B$ signal necessary for the calculation of the impedance is detected minutely so that the square wave injection current $I_{pw}$ or discharge current $I_{sd}$ becomes to flow.

Moreover, the current injecting and discharging circuit 2, the switching means 20, a current connecting means 21, and a stationary battery cell selecting means 22 are connected to each other in the form of a parallel or serial bus 24 to be systemically controlled by the MPU of a embedded system 16. An unit cell charging means 19 having a function of equalizing charge the stationary battery cell is installed to the output side of the stationary battery cell selecting means 22 parallel to the input side of the measuring and calculating circuit 1 and the charging state of the stationary battery cell is monitored by the embedded system 16. If the terminal voltage of the stationary battery cell is low or requires supplement, the unit cell-charging means 19 is controlled to supplement and equalizing charge the respective stationary battery unit/cell.

Furthermore, as described above, 2, 4, 6, 8, order charging ripple current harmonics flow through a single phase rectifying type charger and 3, 6, 9, 12, order charging ripple current harmonics flow through a three phase and three pulse rectifying type charger, and 3, 6, 9, 12, order charging ripple current harmonics flow through a six phase and six pulse rectifying type charger. Output voltages of above-described rectifying type charger include all of the AC current components of the sixth harmonics.

Therefore, it is advantageous that the fundamental frequency necessary for the measurement is determined by the sixth harmonics of the commercial power source frequency 60/50 Hz. However, a designer may adopt a frequency other than the fundamental frequency necessary for the measurement by considering the harmonic ratio of the charger installed in the industrial site and the calculating method of the measuring circuit.

Furthermore, when a large number of stationary battery cells is measured on-line, the waveform of the DC current containing the charging ripple current generated from the string of the stationary battery during the charge through a DC current sensing means such as a shunt, a DC.CT by using the measuring and calculating circuit of the present invention, the fundamental frequency component and the other components similar to that of fundamental frequency, which are required for the measurement, among the components corresponding to the AC constant current $I_S$ and the impedance voltage $V_{IS}$ through the filtering means, and the internal impedance or its effective value can be precisely calculated based on the waveform of the measuring frequency component by the synchronized detection calculating algorithm of the present invention.

Moreover, in the present invention, even when a certain harmonics ripple component is further contained in the square wave AC current $I_B$ in addition to the fundamental frequency component necessary for the measurement or a frequency similar to the fundamental frequency component is further contained, the internal impedance or its effective value can be easily calculated by applying the synchronized detection calculating algorithm of the present invention. These will be described as follows.

Firstly, when the frequency of the commercial power source (60 Hz or 50 Hz) used to floating charge the stationary battery is assumed as $\omega$, the injection current $I_{pw}$ or the discharge current $I_{sd}$ is generated such that the fundamental frequency of the AC current $I_B$ flowing through an object to be measured is identical to (n+0.5) times of the frequency $\omega$ of the commercial power source when the injection current $I_{pw}$ or the discharge current $I_{sd}$ to be used for the measurement of internal impedance of the object to be measured. Here, n is an integer containing 0 (zero). In this case, if a current component corresponding to the fundamental frequency among the AC current $I_B$ is assumed as a sine wave AC current $I_{Bf}$ in a case of a condition where the charging current $I_{ch}$ flowing through the stationary battery is 0 (zero), the AC current $I_B$ can be expressed to be identical to the injection current $I_{pw}$ or the discharge current $I_{sd}$ and can be expressed by a sum of harmonic component $I_{hm}$ and the fundamental frequency component of a sine wave AC current $I_{Bf}$ which is (n+0.5) times of the frequency $\omega$ of the commercial power source.

$$I_{PW} = I_{SD} \qquad \text{Formula 1}$$
$$= I_{Bf} + I_{hm}$$
$$= 2B \cdot \cos\{(n+0.5)\omega t + \Phi\} +$$
$$\sum_{i=2}^{\infty} 2B_i \cdot \cos\{i \cdot (n+0.5)\omega t + \Phi_{i,f}\}$$

where, n is an integer greater than 0 (zero), and $\phi$, $\phi_{i,f}$ are initial phases of a fundamental frequency or an ith harmonic component, and 2B and $2B_i$ are amplitude of the fundamental frequency or the ith harmonic component.

Moreover, since the impedance voltage $V_{IS}$ of the stationary battery is generated by the multiplication of the AC current $I_B$ component expressed by the formula 1 such as the injection current $I_{PW}$ or the discharge current $I_{sd}$ and the internal impedance of the stationary battery, if a voltage component having a fundamental frequency $\omega$ of (n+0.5) times of the frequency $\omega$ of the commercial power source is referred to the fundamental AC voltage $V_{Bf}$, the impedance voltage $V_{IS}$ of the stationary battery can be expressed by a sum of fundamental AC voltage and respective harmonic component $V_{hm}$ like formula 2. In other words, $$V_{IS} = V_{Bf} + V_{hm} \qquad \text{Formula 2}$$
$$= 2A \cdot \cos\{(n+0.5)\omega t + \Phi + \theta\} +$$
$$\sum_{i=2}^{\infty} 2A_i \cdot \cos\{i \cdot (n+0.5)\omega t + \Phi_{i,f} + \theta_{i,f}\}$$

where, $\phi$, $\phi_{i,f}$ are phase differences between the fundamental wave or the corresponding ith order harmonics of the injection current or discharge current and the impedance voltage $V_{IS}$, and $2A$, $2A_i$ are amplitude of the fundamental AC voltage $V_{Bf}$ or the ith order harmonic voltage component.

On the other hand, in general, the harmonics ripple voltage $V_{RP}$ due to the charge current during the floating charge of the stationary battery, as described above, has ripple frequency components of even times of the frequency $\omega$ (60 Hz or 50 Hz) of the commercial power source. However, in the three phase rectifying circuits, since the harmonics ripple voltage may have odd times of ripple frequency components, the harmonics ripple voltage $V_{RP}$ can be expressed by a frequency containing the frequency $\omega$ of the commercial power source and integer times of the frequency $\omega$ like following formula 3.

$$V_{RP} = \sum_{i=1}^{\infty} 2K_i \cdot \cos(i \cdot \omega t + \Phi_{i,RP}) \qquad \text{Formula 3}$$

where, $2K_i$ is a amplitude of the ith order harmonics ripple voltage component, and $\phi_{i,RP}$ is an initial phase of the ith order harmonics ripple voltage component.

Moreover, the charging ripple current $I_{RP}$ flowing through the object to be measured, which is generated by the harmonics ripple voltage $V_{RP}$ can also be expressed by integer times of the frequency $\omega$ of the commercial power source like following formula 4.

$$I_{RP} = \sum_{i=1}^{\infty} 2L_i \cdot \cos(i \cdot \omega t + \Phi_{i,RP} + \theta_{i,RP}) \qquad \text{Formula 4}$$

where, $2L_i$ is a amplitude of the ith order harmonics ripple component, and $\phi_{i,RP}$ is a phase difference between the charging ripple current and the harmonics ripple voltage with respect to the ith order harmonic component.

Meanwhile, since, in the terminal voltage $V_P$ measured at the terminal of the stationary battery, the impedance voltage $V_{IS}$ and the harmonics ripple voltage $V_{RP}$ are overlapped with each other on the internal voltage $V_E$ as an electromotive force of the stationary battery and flow therethrough, the DC component is eliminated by the filtering means so that a pure AC current voltage $V_{SM}$ component which DC current component is eliminated can be expressed by the sum of the formulas 2 and 3. Namely, $$V_{SM} = V_{IS} + V_{RP} \qquad \text{Formula 5-a}$$
$$= (V_{Bf} + V_{hm}) + V_{RP}$$
$$= 2A \cdot \cos\{(n+0.5)\omega t + \Phi + \theta\} +$$
$$\sum_{i=2}^{\infty} 2A_i \cdot \cos\{i \cdot (n+0.5)\omega t + \Phi_{i,f} + \theta_{i,f}\} +$$
$$\sum_{i=1}^{\infty} 2K_i \cdot \cos(i \cdot \omega t + \Phi_{i,RP})$$

Furthermore, since the injection current $I_{pw}$ or the discharge current $I_{RP}$ are measured together with the AC current $I_B$ by the current sensing means and also $I_{ch}=I_{DC}+I_{RP}$, if the DC current component $I_{DC}$ is eliminated, it becomes sum of the formulas 1 and 4.

$$I_B = I_{pw}(I_{sd}) + I_{RP} \qquad \text{Formula 6-a}$$
$$= (I_{Bf} + I_{hm}) + I_{RP}$$
$$= 2B \cdot \cos\{(n+0.5)\omega t + \Phi\} +$$
$$\sum_{i=2}^{\infty} 2B_i \cdot \cos\{i \cdot (n+0.5)\omega t + \Phi_{i,f}\} +$$
$$\sum_{i=1}^{\infty} 2L_i \cdot \cos(i \cdot \omega t + \Phi_{i,RP} + \theta_{i,RP})$$

On the other hand, as an embodiment, the measuring and calculating circuit of the present invention is implemented and designed to have a predetermined broadband like the filtering means 10 and 13, or is implemented and designed to have a resonance frequency $f_r$ identical to or similar to $(n+0.5)\omega$ namely, the fundamental frequency component of the injection current $I_{pw}$ or the discharge current $I_{sd}$ by using the high band pass filter or the low band pass filter having predetermined cut-off frequencies $F_L$ and $F_H$. Then, after passing the filtering means 10 and 13, respective harmonic components of the AC voltage $V_{SM}$ and the AC current $I_B$ have only harmonic component of a frequency band similar to the resonance frequency $f_r$ or a harmonic component of a predetermined frequency band. Therefore, the AC voltage $V_{SM}$ and the AC current $I_B$ after passing the filtering means having the above-mentioned property can be expressed by the following formulas 5-b and 6-b.

$$V_{SM,FIL} = \qquad \text{Formula 5-b}$$
$$2A \cdot \cos\left\{\begin{array}{c}(n+0.5)\\ \omega t + \Phi + \theta\end{array}\right\} + \sum_{i=r}^{t} 2A_i \cdot \cos\left\{\begin{array}{c}i \cdot (n+0.5)\\ \omega t + \Phi_{i,f} + \theta_{i,f}\end{array}\right\} +$$
$$\sum_{i=s}^{n} 2K_i \cdot \cos(i \cdot \omega t + \Phi_{i,RP})$$

$$I_{B,FIL} = 2B \cdot \cos\left\{\begin{array}{c}(n+0.5)\\ \omega t + \Phi\end{array}\right\} + \sum_{i=r}^{t} 2B_i \cdot \cos\left\{\begin{array}{c}i \cdot (n+0.5)\\ \omega t + \Phi_{i,f}\end{array}\right\} + \qquad \text{Formula 6-b}$$
$$\sum_{i=s}^{n} 2L_i \cdot \cos\left(\begin{array}{c}i \cdot \omega t +\\ \Phi_{i,RP} + \theta_{i,RP}\end{array}\right)$$

where, r and s become arbitrary integers smaller than n, and t and u are arbitrary integers greater than n respectively. When the filtering means 10 and 13 have the narrow band pass characteristics, and r and s become integers that are smaller and very adjacent to n, t and u become arbitrary integers greater than and very adjacent to n. Moreover, on the contrary, when the filtering means have the broadband pass characteristics, r and s or t and u that are not adjacent to n may be selected.

Moreover, when the filtering means is implemented by low band pass filters, r and s become integers smaller than n and including 1 (one) or integers adjacent to 1 (one), and t and u become arbitrary integers greater than and very adjacent to n. Furthermore, when the filtering means is implemented by the high band pass filters, r and s become smaller than and very adjacent to n, and t and u become arbitrary integers very greater than n respectively.

If a cosine wave $C_1$ and a sine wave $S_1$ expressed by the following formulas 7 and 8 are obtained by a synchronized frequency that is correctly synchronous to the fundamental AC voltage $V_{Bf}$ of the impedance voltage $V_{IS}$ or the fundamental frequency of the AC current $I_B$ by a certain means, $$C_1 = \cos[(n+0.5) \cdot wt] \qquad \text{Formula 7}$$

$$S_1 = \sin[(n+0.5) \cdot wt] \qquad \text{Formula 8}$$

The AC voltages $V_{SM,FIL}$ just after passing the filtering means of the formula 5-b and the AC currents $I_{B,FIL}$ just after passing the filters of the formula 6-b are multiplied to formulas 7 and 8 respectively so that the following calculation terms $m_1$, $m_2$, $m_3$, and $m_4$ can be calculated.

$$m_1 = V_{SM,FIL} \cdot C_1 = A \cdot \cos\left\{\begin{array}{c} 2 \cdot (2n+1) \cdot \\ 0.5\omega t + \Phi + \theta \end{array}\right\} + A \cdot \cos(\Phi + \theta) + \qquad \text{Formula 9}$$

$$A_i \cdot \sum_{i=r}^{t} \left[\begin{array}{c} \cos\left\{\begin{array}{c} (i+1) \cdot (2n+1) \cdot \\ 0.5\omega t + \Phi_{i,f} + \theta_{i,f} \end{array}\right\} + \\ \cos\left\{\begin{array}{c} (i-1) \cdot (2n+1) \cdot \\ 0.5\omega t + \Phi_{i,f} + \theta_{i,f} \end{array}\right\} \end{array}\right] +$$

$$K_i \cdot \sum_{i=s}^{n} \left[\begin{array}{c} \cos\left\{\begin{array}{c} 2 \cdot (i+n+0.5) \cdot \\ 0.5\omega t + \Phi_{i,RP} \end{array}\right\} + \\ \cos\left\{\begin{array}{c} 2 \cdot (i-n-0.5) \cdot \\ 0.5\omega t + \Phi_{i,RP} \end{array}\right\} \end{array}\right]$$

$$m_2 = I_{B,FIL} \cdot S_1 = B \cdot \sin\left\{\begin{array}{c} 2 \cdot (2n+1) \cdot \\ 0.5\omega t + \Phi \end{array}\right\} - \qquad \text{Formula 10}$$

$$B \cdot \sin(\Phi) + B_i \cdot \sum_{i=r}^{t} \left[\begin{array}{c} \sin\left\{\begin{array}{c} (i+1) \cdot (2n+1) \cdot \\ 0.5\omega t + \Phi_{i,f} \end{array}\right\} - \\ \sin\left\{\begin{array}{c} (i-1) \cdot (2n+1) \cdot \\ 0.5\omega t + \Phi_{i,f} \end{array}\right\} \end{array}\right] -$$

$$L_i \cdot \sum_{i=s}^{n} \left[\begin{array}{c} \sin\left\{\begin{array}{c} 2 \cdot (i+n+0.5) \cdot \\ 0.5\omega t + \Phi_{i,RP} + \theta_{i,RP} \end{array}\right\} - \\ \sin\left\{\begin{array}{c} 2 \cdot (i-n-0.5) \cdot \\ 0.5\omega t + \Phi_{i,RP} + \theta_{i,RP} \end{array}\right\} \end{array}\right]$$

$$m_3 = V_{SM,FIL} \cdot S_1 = A \cdot \sin\left\{\begin{array}{c} (2n+1) \cdot \\ \omega t + \Phi + \theta \end{array}\right\} - A \cdot \sin(\Phi + \theta) + \qquad \text{Formula 11}$$

$$A_i \cdot \sum_{i=r}^{t} \left[\begin{array}{c} \sin\left\{\begin{array}{c} (i+1) \cdot (2n+1) \cdot \\ 0.5\omega t + \Phi_{i,f} + \theta_{i,f} \end{array}\right\} - \\ \sin\left\{\begin{array}{c} (i-1) \cdot (2n+1) \cdot \\ 0.5\omega t + \Phi_{i,f} + \theta_{i,f} \end{array}\right\} \end{array}\right] +$$

$$K_i \cdot \sum_{i=s}^{n} \left[\begin{array}{c} \sin\left\{\begin{array}{c} 2 \cdot (i+n+0.5) \cdot \\ 0.5\omega t + \Phi_{i,RP} \end{array}\right\} - \\ \sin\left\{\begin{array}{c} 2 \cdot (i-n-0.5) \cdot \\ 0.5\omega t + \Phi_{i,RP} \end{array}\right\} \end{array}\right]$$

$$m_4 = I_{B,FIL} \cdot C_1 = B \cdot \cos\left\{\begin{array}{c} (2n+1) \cdot \\ \omega t + \Phi \end{array}\right\} + \qquad \text{Formula 12}$$

$$B \cdot \cos(\Phi) + B_i \cdot \sum_{i=r}^{t} \left[\begin{array}{c} \cos\left\{\begin{array}{c} (i+1) \cdot (2n+1) \cdot \\ 0.5\omega t + \Phi_{i,f} \end{array}\right\} + \\ \cos\left\{\begin{array}{c} (i-1) \cdot (2n+1) \cdot \\ 0.5\omega t + \Phi_{i,f} \end{array}\right\} \end{array}\right] +$$

$$L_i \cdot \sum_{i=s}^{n} \left[\begin{array}{c} \cos\left\{\begin{array}{c} 2 \cdot (i+n+0.5) \cdot \\ 0.5\omega t + \Phi_{i,RP} + \theta_{i,RP} \end{array}\right\} + \\ \cos\left\{\begin{array}{c} 2 \cdot (i-n-0.5) \cdot \\ 0.5\omega t - \Phi_{i,RP} + \theta_{i,RP} \end{array}\right\} \end{array}\right]$$

The respective calculation terms of the formulas 9~12 includes a DC component that is not varied with respect to time t and a sine wave harmonic AC component that is periodically ($\omega_t$) varied with respect to time t.

In this case, the AC components of the formulas 9~12 have angle frequencies expressed by integer times of $0.5\omega$. Moreover, when the formulas 9~12 are integrated by taking an integration period $T_D$ such as the following formula 13 respectively, as a result of the calculation thereof, all the AC component terms of the respective terms of the formulas 9~12 becomes 0 (zero) except the DC component terms. As a result, the values of multiplying the integration period $T_D$ to the DC component terms are obtained.

Moreover, in the respective calculation terms of the formulas 9~12, if r and s become arbitrary integers smaller than n, and t and u satisfy only arbitrary integers greater than n respectively, all the AC component terms can become 0 (zero). When considering a case where t and u are arbitrary integers very greater than n, a high speed digital signal processor (DSP) should be selected that the integration for the predetermined integration period $T_D$ can be correctly carried out for the very high order harmonic component terms and precision of the calculation can be secured. As such, in a case when the MPU of the embedded system 16 is employed as the digital signal processor and carry out filtering through an internal program, the above-mentioned calculation is possible when the filtering means are simply designed to have the characteristics of the low band cut-off filter (high band pass filter) if consider a difficulty of forming a hardware circuits. On the contrary, when considering a case where integers r and s become arbitrary integers very smaller than n including 1 (one), it is sufficient that the band pass filter is simply designed to have a characteristics of the high band cut-off filter (low band pass filter).

In other words, as expressed by the following formulas 13 and 14, when the periodic integration for a sine wave function having a certain frequency or integer times of the frequency is carried out, all of the sine wave AC component terms in the formulas 9~12 can be eliminated by using the property that the result of the integration becomes 0 (zero) even when arbitrary order harmonic component is included.

$$T_D = \frac{2\pi}{0.5\omega} \qquad \text{Formula 13}$$

$$\int_0^{T_s} \sin(p \cdot \omega_s t) = \int_0^{T_s} \cos(P \cdot \omega_s t) = 0 \qquad \text{Formula 14}$$

Since values obtained from the integration are expressed by values of multiplying the integration period $T_D$ to the DC components of the formulas 9~12, when the result values are divided by the integration period $T_D$ and the divided values are defined as $M_1$, $M_2$, $M_3$, and $M_4$, the values can be expressed by the following formulas 15~18.

$$M_1 = \frac{A \cdot \cos(\Phi + \theta) \cdot T_D}{T_D} = A \cdot \cos(\Phi + \theta) \qquad \text{Formula 15}$$

$$M_2 = \frac{-B \cdot \sin(\Phi) \cdot T_D}{T_D} = -B \cdot \sin(\Phi) \qquad \text{Formula 16}$$

$$M_3 = \frac{-A \cdot \sin(\Phi + \theta) \cdot T_D}{T_D} = -A \cdot \sin(\Phi + \theta) \qquad \text{Formula 17}$$

$$M_4 = \frac{B \cdot \cos(\Phi) \cdot T_D}{T_D} = B \cdot \cos(\Phi) \qquad \text{Formula 18}$$

When the following formula 19 is calculated by using the formulas 15~18, a result value of the formula 19 becomes identical to the effective value of the internal impedance so that the effective value of the internal impedance can be simply obtained by using the following formula 19.

$$\frac{M_1 M_4 + M_2 M_3}{M_2^2 + M_4^2} = \frac{2A}{\sqrt{2}} \cdot \frac{1}{\left\{\frac{2B}{\sqrt{2}}\right\}} \cdot \cos(\theta) \qquad \text{Formula 19}$$

$$= \frac{V_{B,EFF}}{I_{B,EFF}} \cdot \cos(\theta)$$

where, as expressed in the formula 2, 2A is a amplitude of the fundamental AC voltage $V_{Bf}$ among the impedance voltage $V_{IS}$ of the stationary battery and 2B is a amplitude of the sine wave AC current $I_{Bf}$, the fundamental frequency component. Therefore, $V_{B,EFF}$ may be an effective value of the fundamental AC voltage $V_{Bf}$ and $I_{B,EFF}$ may be expressed by the effective value of the sine wave AC current $I_{Bf}$.

In other words, the fundamental frequency of the AC current $I_B$ is set to (n+0.5) times of the frequency of the commercial power source (60 Hz or 50 Hz) ω the respective calculation terms $m_1$, $m_2$, $m_3$, and $m_4$ of the formulas 9~12 are calculated with the AC voltages $V_{SM}$ and the AC current $I_B$ in which the charging ripple current $I_{RP}$ and the harmonics ripple voltage $V_{RP}$ are mixed with each other, and integrated for the predetermined integration period $T_D$ to make all the AC component terms be 0 (zero) except the DC component so that the $M_1$, $M_2$, $M_3$, and $M_4$ terms composed of only DC components are obtained. Therefore, the effective impedance can be calculated precisely and simply through the calculation process by the synchronized detecting method to the formula 19.

Moreover, in detailed description of the calculation process, the integration period $T_D$, which is used to extract the $M_1$, $M_2$, $M_3$, and $M_4$ terms composed of only DC components from the calculation terms $m_1$, $m_2$, $m_3$, and $m_4$ of formulas 9~12, can be determined by the period corresponding to frequencies of the greatest common divider between result values obtained by adding or subtracting the frequencies of all AC components of forming the AC voltage $V_{SM}$ or the AC current $I_B$ or the frequencies of the AC voltages $V_{SM,FIL}$ which passed the filter means or all AC components of forming the AC currents $I_{B,FIL}$, or by integer times of the obtained period.

Moreover, in order to reduce time for calculating effective impedance (resistance) and to enhance economical profit, the greatest common divider between the added or subtracted values must be minimized. The fundamental frequency of the AC current $I_B$ supplied to the stationary battery cell is set to be different from the frequencies of a certain harmonics of forming the harmonics ripple voltage $V_{RP}$, and further, at first step the frequency band is selected by a designer, the respective harmonics of forming the harmonics ripple voltage $V_{RP}$ are arranged in the order of magnitude, and the order of fundamental frequency of the AC current $I_B$ is selected to be identical to an average value of two harmonic frequencies adjacent to each other within the primarily selected range so that the integration period $T_D$ can be minimized. Never to say, although the amount of the calculation is increased when the integration period $T_D$ is set to integer times of the selected period and is integrated, it is advantageous that the error occurring during the measurement can be reduced.

Furthermore, in general, the frequency of the commercial power source is 60 Hz or 50 Hz. Therefore, when the fundamental frequency of the measuring signal supplied to the stationary battery cell is set to integer times of 10 Hz in accordance with the above-mentioned technical topology, the greatest common divider between the result values of adding or subtracting the AC voltages $V_{SM,FIL}$ or frequencies of all AC components of forming the AC currents $I_{B,FIL}$ is determined to 10 Hz regardless the frequency of commercial power source. As a result, when the integration is carried out for a period corresponding to 10 Hz or integer times of the period, the measuring signal of identical frequency can be determined regardless of the frequency of the commercial power source 60 Hz or 50 Hz and all AC component terms become 0 (zero) so that $M_1$, $M_2$, $M_3$, and $M_4$ terms composed of only DC components can be obtained. Therefore, the effective impedance can be calculated through the calculation due to the synchronized detecting method to the formula 19.

Moreover, when the charging current $I_{ch}$ flows through the batteries or the string of the stationary batteries, as described above, the charging ripple current $I_{RP}$ due to the harmonics ripple voltage $V_{RP}$ in the charging current $I_{ch}$ flows through the stationary battery to be measured. The charging ripple current $I_{RP}$ is contained in the AC current $I_B$ so that, like the on-line apparatus in FIG. 4, a circuit can be constructed such that the charging ripple current $I_{RP}$ are detected by the current sensing means 5a~5n.

In this case, when the injection current $I_{pw}$ or the discharge current $I_{sd}$ is generated such that the measuring frequency of the AC current $I_B$ is identical to an arbitrary order harmonic component of the charging ripple current $I_{RP}$ (preferably, the first harmonic component or lower order component) and is in phase together with, the component of the impedance voltage $V_{IS}$ is generated by the harmonics of the ripple current $I_{RP}$ identical to the measuring frequency of the AC current $I_B$ selected in the above process.

As such, the harmonic component of the harmonics ripple voltage, which is generated by the harmonic components of the charging ripple current $I_{RP}$ having the same frequency as the fundamental frequency of the injection current $I_{pw}$ or the discharge current $I_{sd}$, is added to the impedance voltage $V_{IS}$ component generated by the fundamental frequency of the AC current $I_B$. By doing so, a AC voltage $V_{Bf}$ at high level, namely the fundamental frequency component of the impedance voltage $V_{IS}$ necessary for the measurement can be obtained.

As described above, It is a merit of the present art that when the fundamental frequency of the AC current $I_B$ is controlled to synchronize with the arbitrary order harmonic component of the charging ripple current $I_{RP}$, the large fundamental AC voltage $V_{Bf}$ of the impedance voltage $V_{IS}$ can be obtained. However, the frequency of the arbitrary order harmonic component of the charging ripple current $I_{RP}$ is influenced by the variation of the frequency of the commercial power source. Moreover, since the period of the first harmonic frequency must be precisely read in order to calculate the integration period $T_D$ necessary for the impedance calculation, a period reading circuit 18 must read the period by analyzing the fundamental frequency of the impedance voltage $V_{IS}$ signal filtered by the filtering means 13.

The above condition corresponds to a condition in which an order (n+0.5) of the fundamental frequency is replaced to an arbitrarily selected integer k (0<k<n) in formulas 1~12. Here, since the respective calculation terms $m_1$, $m_2$, $m_3$, and $m_4$ have the respective angle frequencies expressed by integer times of ω when the formulas 9~12 are integrated by taking another integration period $T_D$ corresponding to the frequency of the commercial power source of the following formula 20, and as a result of the calculation, all the AC component terms of the above respective terms become 0 (zero) except the DC components.

$$T_{D'} = \frac{2\pi}{\varpi}$$ Formula 20

As a result of the integration, the DC component $M_1$, $M_2$, $M_3$, and $M_4$ are obtained and the effective internal impedance can be calculated by the formula 19.

Hereinafter, a method of measuring and calculating an effective component of an internal impedance of a stationary battery according to the present invention will be described in detail referring to related drawings.

FIG. 13 is a flowchart illustrating the method of measuring and calculating the effective component of the internal impedance of the stationary battery according to the present invention.

Firstly, as illustrated in FIG. 13, in the measuring and calculating method according to the present invention, a measuring signal of the square wave injection current $I_{pw}$ or discharge current $I_{sd}$ is controlled to flow through an object to be measured (S201).

At this time, the measuring signal of the square wave injection current $I_{pw}$ or the discharge current $I_{sd}$ is controlled in the form of a voltage type or current type by PWM or PAM control and is supplied to the object to be measured.

Meanwhile, the measuring signal of the square wave injection current $I_{pw}$ or the discharge current $I_{sd}$ is controlled by a conduction period of 120 degrees or 180 degrees or PWM-controlled to a large number of sequential pulses for a conduction period of 120 degrees or 180 degrees.

Moreover, the fundamental frequency of the measuring signal of the square wave injection current $I_{pw}$ or the discharge current $I_{sd}$ is preferably determined to be identical to any one of 0.5 times, integer times, (n+0.5) times, and a sixth harmonics of a frequency of a commercial power source, and integer times of 10 Hz.

Next, only the frequency component necessary for the measuring and calculating among the frequency components of the square wave measuring signal is filtered by filtering means or the filtering program in the measuring and calculating device (S202).

Further, the frequency component of the impedance voltage necessary for the measuring and calculating among the impedance voltage signal of the object to be measured that is detected by the square wave measuring signal is filtered (S203).

Next, using the filtered measuring signal and the measuring frequency component of the impedance voltage signal, the internal impedance or the effective value of the internal impedance is calculated (S204).

Although the preferred embodiments of the present invention have been disclosed for illustrative purposes, those skilled in the art will appreciate that various modifications, additions and substitutions are possible, without departing from the scope and topology of the invention as disclosed in the accompanying claims. Modifications and equivalents will be apparent to those skilled in the art and are encompassed within the scope and topology of the appended claims.

INDUSTRIAL APPLICABILITY

According to the device to calculating the internal impedance of a stationary battery or a string of the stationary batteries or the effective value of the internal impedance and the method thereof, the fundamental frequency of the AC current $I_B$ may be selected to be identical to the lower order harmonic frequency of the charging ripple current $I_{RP}$. Therefore, the impedance voltage $V_{IS}$ component corresponding to the selected charging ripple current $I_{RP}$ is generated and the internal impedance or the effective value of the internal impedance is calculated so that the influence of the harmonics ripple voltage $V_{RP}$ during the calculation can be eliminated.

Moreover, in the medical diagnosis of dropsy, the square wave AC current is supplied to the dropsy like the above description and the magnitude and phase of induced voltage at the dropsy so that the status of the dropsy can be diagnosed. In the diagnosis of the dropsy, even when noise is mixed with an input signal, the measuring signal can be measured by being separated from the noise voltage. Even when an electrolytic capacitor in a power conversion equipment is deteriorated by which electrolyte is evaporated, the capacitance of the capacitor can be estimated by applying the same measuring principle as provided by the present invention and the inferior status of the electrolytic capacitor can be diagnosed.

in a pipe or to determine whether an electric line is grounded or not. Moreover, the present invention can be applied to measure a flow rate.

SEQUENCE LISTING

Not

The invention claimed is:

1. A method of measuring an internal impedance of a stationary battery as an object to be measured and an effective value of the internal impedance, the method comprising:
controlling a measuring signal to flow through the object; the measuring signal is an injection current (Ipw) or a discharge current (Isd) in the shape of a square wave;
filtering a predetermined frequency component necessary for the measurement among frequency components of the measuring signal by a filtering means or by performing a filtering program, the predetermined frequency component being necessary for the measurement of the internal impedance;
filtering an impedance voltage of the predetermined frequency component among an impedance voltage signal of the object to be measured, the impedance voltage signal being generated by the square measuring signal; and
calculating the internal impedance and the effective value of the internal impedance by using the filtered measuring signal and the filtered impedance voltage signal.

2. The method according to claim 1, wherein the measuring signal is controlled by a pulse width modulation or a pulse amplitude modulation.

3. The method according to claim 1, wherein the measuring signal is controlled to have a conduction angle of 120 degrees or 180 degrees.

4. The method according to claim 1, wherein the measuring signal is controlled by a large number of pulses by a pulse width modulation for a conduction period of 120 degrees or 180 degrees.

5. The method according to claim 1, further comprising:
selecting a fundamental frequency of the measuring signal;
calculating respective calculating terms from an alternating current voltage, an AC current, a cosine wave, and a sine wave;
determining a predetermined integration period necessary for the calculation by obtaining the greatest common divider between values which are obtained by adding and subtracting all frequency components each other of forming the alternating voltage or the AC current or values which are obtained by adding and subtracting all frequency components each other of forming alternating current voltages or AC currents, the predetermined integration period being a period corresponding to a frequency of the greatest common divider or an integer times thereof; and integrating the calculating terms for the predetermined integration period to obtain respective calculating terms having only direct current components.

6. The method according to claim 1, wherein the measuring signal comprises a voltage waveform generated by controlling a power source by the pulse width modulation or the pulse amplitude modulation.

7. An internal impedance measuring device of a stationary battery for measuring an internal impedance of respective stationary battery cells comprising a large number of stationary batteries or an effective value of the internal impedance, the device comprising:

a current injecting and discharging circuit to make a measuring signal flow through the stationary battery cells of respective strings of stationary batteries, the measuring signal being an injection current (Ipw) or discharge current (Isd) in the shape of a square wave;

current sensing means, installed to respective strings of the stationary batteries, detecting an AC current containing the measuring signal that flows through the respective strings of the stationary batteries;

a switch configured to switch the AC current detected by the current sensing means and an additional current sensing means installed to an output end of the current injecting and discharging circuit to a measuring and calculating circuit;

a current connecting means to switch the measuring current to the respective strings of the stationary batteries; and the measuring and calculating circuit to calculate the internal impedance or the effective value of the internal impedance using the measuring signal and a measuring frequency component of an impedance voltage signal of the battery cells.

8. An internal impedance measuring device of a stationary battery for measuring an internal impedance of respective stationary battery cells or an effective value of the internal impedance, the device comprising:

a current injecting and discharging circuit to generate a measuring signal for generating a voltage component of the internal impedance of the stationary battery cells, the measuring signal being an injection current (Ipw) or discharge current (Isd) in the shape of a square wave;

a current sensing means to detect the measuring signal flowing through the stationary battery cells; and a measuring and calculating circuit to calculate the internal impedance or the effective value of the internal impedance using the measuring signal and a measuring frequency component of an impedance voltage of the stationary battery cells.

9. The internal impedance measuring device according to claim 7, wherein the current injecting and discharging circuit is controlled by a pulse width modulation or a pulse amplitude modulation to generate the measuring signal.

10. The internal impedance measuring device according to claim 7, wherein the current injecting and discharging circuit generates the measuring signal controlled by a conduction angle of 120 degrees or 180 degrees.

11. The internal impedance measuring device according to claim 7, wherein the current injecting and discharging circuit generates the measuring signal controlled by a large number of pulses by the pulse width modulation for a conduction angle of 120 degrees or 180 degrees.

12. The internal impedance measuring device according to claim 7, wherein the fundamental frequency of the measuring signal is determined to be identical to any one of 0.5 times, integer times, (n+0.5) times, and a sixth harmonics of a frequency of a commercial power source, and times of 10 Hz.

13. The internal impedance measuring device according to claim 7, further comprising a charger configured to charge the string of the stationary batteries including a large number of stationary batteries, wherein the measuring and calculating circuit measures the internal impedance or the effective value of the internal impedance using an impedance voltage component generated by a first harmonics or a lower order harmonic component of a charging ripple current applied from the charger.

14. The internal impedance measuring device according to claim 7, wherein the current injecting and discharging circuit generates the injection current (Ipw) or discharge current (Isd) such that the fundamental frequency of the measuring signal is in phase with the first harmonics or the lower order harmonics of the charging ripple current, and wherein the internal impedance and the effective value is calculated by using the measuring signal and impedance voltage.

15. The internal impedance measuring device according to claim 7, wherein the measuring and calculating circuit comprises:

a first filtering means to filter the fundamental frequency component and the measuring signal of a similar frequency component from the AC current;

a differential amplifying circuit to divide or amplify terminal voltages of the stationary battery cells;

a direct current coupling circuit to filter only the impedance voltage of the stationary battery cells from the terminal voltages;

a second filtering means to filter the fundamental frequency component necessary for the measurement and the similar frequency component from the impedance voltage; and an analog/digital converter to convert an analog signal filtered by the first and second filtering means into a digital signal.

16. The internal impedance measuring device according to claim 15, wherein the measuring and calculating circuit further comprises a period reading circuit to a period of the fundamental frequency component filtered by the second filtering means.

17. The internal impedance measuring device according to claim 15, wherein the measuring and calculating circuit further comprises a direct current coupling circuit to filter only alternating current component of the AC current containing the injection current (Ipw) or the discharge current (Isd).

* * * * *